(12) United States Patent
Cao et al.

(10) Patent No.: US 11,616,341 B2
(45) Date of Patent: Mar. 28, 2023

(54) SYSTEMS AND METHODS FOR CHIP-SCALE LASERS WITH LOW SPATIAL COHERENCE AND DIRECTIONAL EMISSION

(71) Applicant: Yale University, New Haven, CT (US)

(72) Inventors: Hui Cao, New Haven, CT (US); Stefan Wolfgang Bittner, Metz (FR); Kyungduk Kim, New Haven, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 16/937,985

(22) Filed: Jul. 24, 2020

(65) Prior Publication Data

US 2021/0028602 A1 Jan. 28, 2021

Related U.S. Application Data

(60) Provisional application No. 62/877,916, filed on Jul. 24, 2019.

(51) Int. Cl.
*H01S 5/068* (2006.01)
*H01S 5/183* (2006.01)
*G02B 27/48* (2006.01)

(52) U.S. Cl.
CPC .......... *H01S 5/18386* (2013.01); *G02B 27/48* (2013.01); *H01S 5/06817* (2013.01)

(58) Field of Classification Search
CPC ............. H01S 5/06817; H01S 5/18386; H01S 2301/16; H01S 5/0652; H01S 5/1082; H01S 5/1003; G02B 17/0605
USPC .................................................. 372/38.08
See application file for complete search history.

(56) References Cited

U.S. PATENT DOCUMENTS

| 5,563,902 A * | 10/1996 | Xu ........................ H01S 5/0424 372/46.01 |
| 5,721,750 A * | 2/1998 | Kwon ...................... H01S 5/10 438/31 |
| 2005/0163184 A1 * | 7/2005 | Hilliard ............... H01S 3/08004 372/66 |

OTHER PUBLICATIONS

Arnaud, Degenerate Optical Cavities, Appl. Opt. 8, 189-196, 1969.
Lowenthal, et al., Speckle Removal by a Slowly Moving Diffuser Associated with a Motionless Diffuser, J. Opt. Soc. Am., 61, 847-851, 1971.
Lang, et al., Lateral Modes of Broad Area Semiconductor Lasers: Theory and Experiment, IEEE J. Quantum Electron. 27, 312, 1991.
Gouedard, et al., Generation of Spatially Incoherent Short Pulses in Laser-Pumped Neodymium Stoichiometric Crystals and Powders, J, Opt. Soc. Am. B 10, 2358-2363, 1993.
Biellak, et al., Lateral Mode Behavior of Reactive-Ion-Etched Stable-Resonator Semiconductor Lasers, J. Appl. Phys., 78, 4294-4296, 1995.

(Continued)

*Primary Examiner* — Tuan N Nguyen
(74) *Attorney, Agent, or Firm* — McCarter & English, LLP

(57) ABSTRACT

Exemplary embodiments of the present disclosure include chip-scale laser sources, such as semiconductor laser sources, that produce directional beams with low spatial coherence. The lasing modes are based on the axial orbit in a stable cavity and have good directionality. To reduce the spatial coherence of emission, the number of transverse lasing modes can be increased by fine-tuning the cavity geometry. Decoherence is reached in as little as several nanoseconds. Such rapid decoherence facilitates applications in ultrafast speckle-free full-field imaging.

20 Claims, 17 Drawing Sheets

(56) References Cited

OTHER PUBLICATIONS

Fukushima, et al., Ring and Axis Mode Lasing in Quasi-Stadium Laser Diodes with Concentric End Mirrors, Opt. Lett., 27, 1430-1432, 2002.
Hentschel, et al., Husimi Functions at Dielectric Interfaces: Inside-Outside Duality for Optical Systems and Beyond, Europhys. Lett., 62, 636, 2003.
Neuman, et al., Optical Trapping, Rev. Sci. Instrum, 75, 2787-2809, 2004.
Gigan, et al., Image Transmission Through a Stable Paraxial Cavity, Phys. Rev., a 72, 023804, 2005.
Peeters, et al., Spatial Decoherence of Pulsed Broad-Area Vertical-Cavity Surface-Emitting Laers, Opt. Express, 13, 9337-9345, 2005.
Goodman, Speckle Phenomena in Optics: Theory and Applications, Chapter 5 Optical Methods for Suppressing Speckle, Roberts and Company Publishers, 2007.
Mandre, et al., Evolution from Modal to Spatially Incoherent Emission of a Broad-Area Vcsel, Opt. Express, 16, 4452-4464, 2008.
Craggs, et al., Thermally Controlled Onset of Spatially Incoherent Emission in a Broad-Area Vertical-Cavity Surface-Emitting Laser, IEEE J. Sel. Top. Quantum Electron., 15, 555,562, 2009.
Noordman, et al., Speckle in Optical Lithography and its Influence on Linewidth Roughness, J. Micro/Nanolith., MEMS MOEMS, 8, 043002, 2009.
Akram, et al., Laser Speckle Reduction Due to Spatial and Angular Diversity Introduced by Fast Scanning Micromirror, Appl. Opt., 49, 3297-3304, 2010.
Chellappan, et al., Laser-Based Displays: A Review, Appl. Opt., 49, F79-F98, 2010.
Ge, et al., Steady-State Ab Initio Laser Theory: Generalizations and Analytic Results, Phys. Rev. A, 82, 063824, 2010.
Kubota, et al.Very Efficient Speckle Contrast Reduction Realized by Moving Diffuser Device, Appl. Opt., 49, 4385-4391, 2010.
Redding, et al., Spatial Coherencfe of Random Laser Emission, Opt. Lett., 36, 3404-3406, 2011.
Fukushima, et al., Lowest-Order Axial and Ring Mode Lasing in Confocal Quasi-Stadium Laser Diodes, Appl. Opt., 51, 2515-2510, 2012.
Geri, et al., Perceptual Assessment of Laser-Speckle Contrast, J. Soc. Inf. Display, 20, 22-27, 2012.
Redding, et al., Speckle-Free Laser Imaging Using Random Laser Illumination, Nat. Photonics, 6, 355, 2012.
Mermillod-Blondin, et al., Time-Resolved Microscopy with Random Lasers, Opt. Lett., 38, 4112-4115, 2013.
Nixon et al.,Efficient Method for Controlling the Spatial Coherence of a Laser, Opt. Letter, 38, 3858-3861, 2013.
Redding, et al., Low-Loss High-Speed Speckle Reduction Using a Colloidal Dispersion, Appl. Opt., 52, 1168-1172, 2013.
Roelandt, et al., Human Speckle Perception Threshold for Still Images, From a Laser Projection System, Opt. Express, 22, 23965-23979, 2014.
Chriki, et al., Manipulating the Spatial Coherence of a Laser Source, Opt. Express, 23, 12989-12997, 2015.
Redding, et al., Low Spatial Coherence Electrically Pumped Semiconducftor Laser for Speckle-Free Full-Field Imaging, Proc. Natl. Acad. Sci. USA, 112, 1304-1309, 2015.
Cerjan, et al., Controlling Mode Competition by Tailoring the Spatial Pump Distribution in a Laser: A Resonance-Based Approach, Opt. Express, 24, 26006-26015, 2016.
Hokr, et al., A Narrow-Band Speckle-Free Light Source Via Random Raman Lasing, J. Mod. Opt., 63, 46-49, 2016.
Knitter, et al., Coherence Switching of a Degenerate Vecsel for Multimodality Imaging, Optica, 3, 403-406, 2016.
Hartmann, et al., A Novel Semiconductor-Based, Fully Incoherent Amplified Spontaneous Emission Light Source for Ghost Imaging, Sci. Rep., 7, 41866, 2017.
Bianco, et al., Strategies for Reducing Speckle Noise, in Digital Holography, Light: Sci. & Appl., 7, 48, 2018.
Bittner, et al., Suppressing Spatiotemporal Lasing Instabilities with Wave-Chaotic Microcavities, Sciencfe, 361, 1225-1231, 2018.
Chriki, et al., Spatiotemporal Supermodes: Rapid Reduction of Spatial Coherence in Highly Multimode Lasers, Phys. Rev. A, 98, 023812, 2018.
Cao, et al., Complex Lasers with Controllable Coherenece, Nat. Rev. Phys., 156-168, 2019.
U.S. Appl. No. 62/877,916, filed Jul. 24, 2019.
Siegman, Lasers, Chapter 19: Stable Two-Mirror Resonators, University Science Books, 1986.
Dainty, et al., Laser Speckle and Related Phenomena, Chapter 4: Speckle Reduction, vol. 9, Springer Science & Business Media. 1984.

* cited by examiner

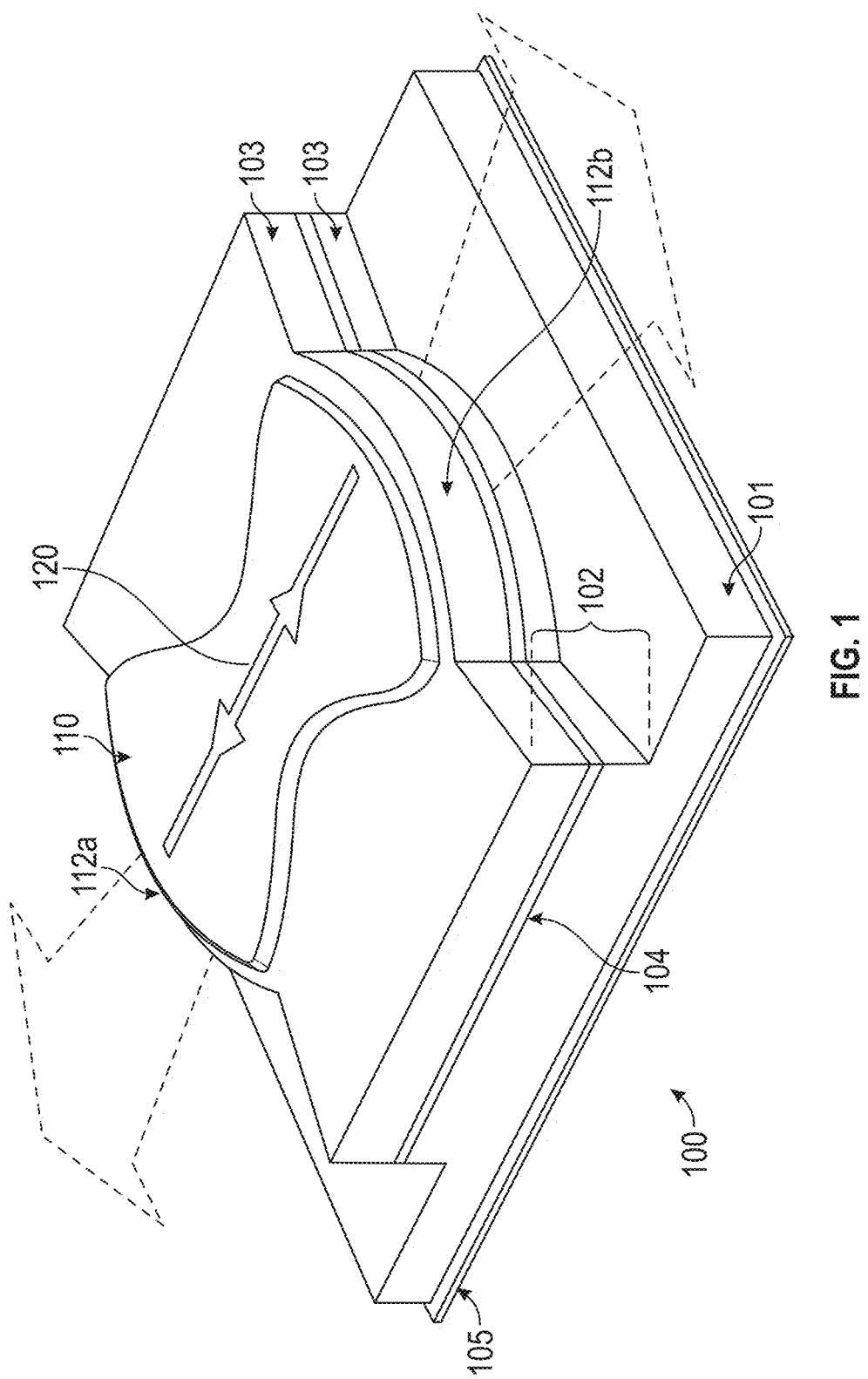

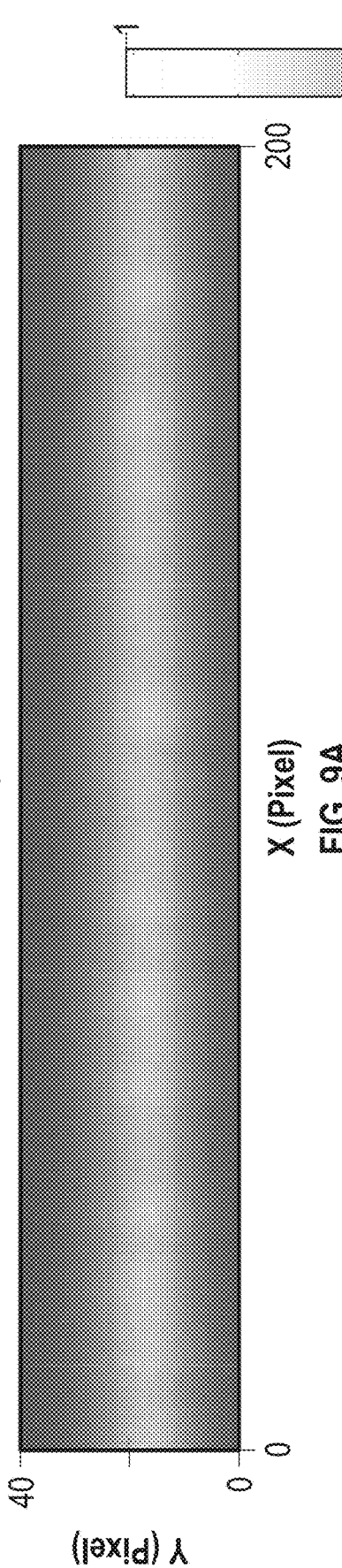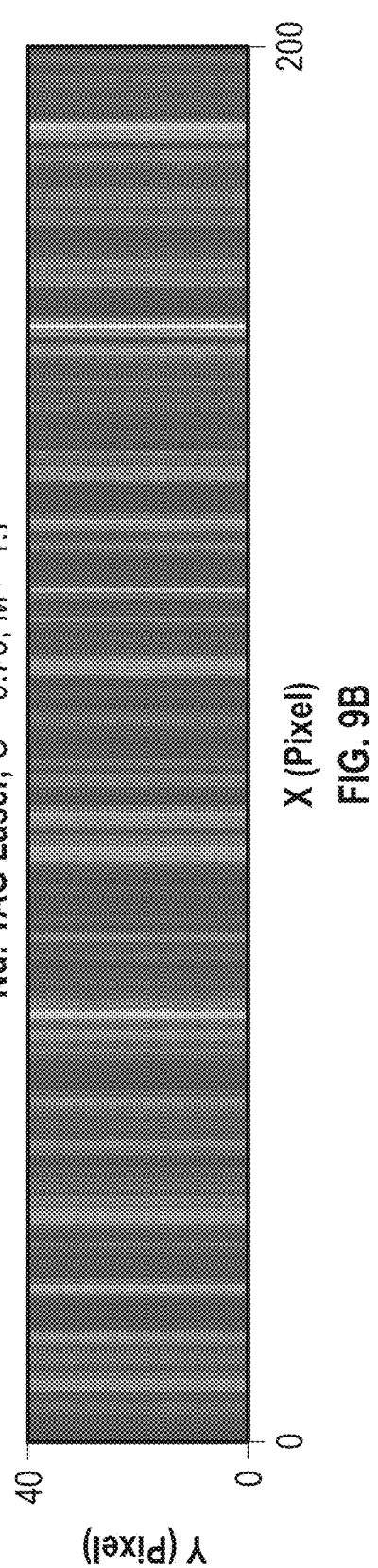

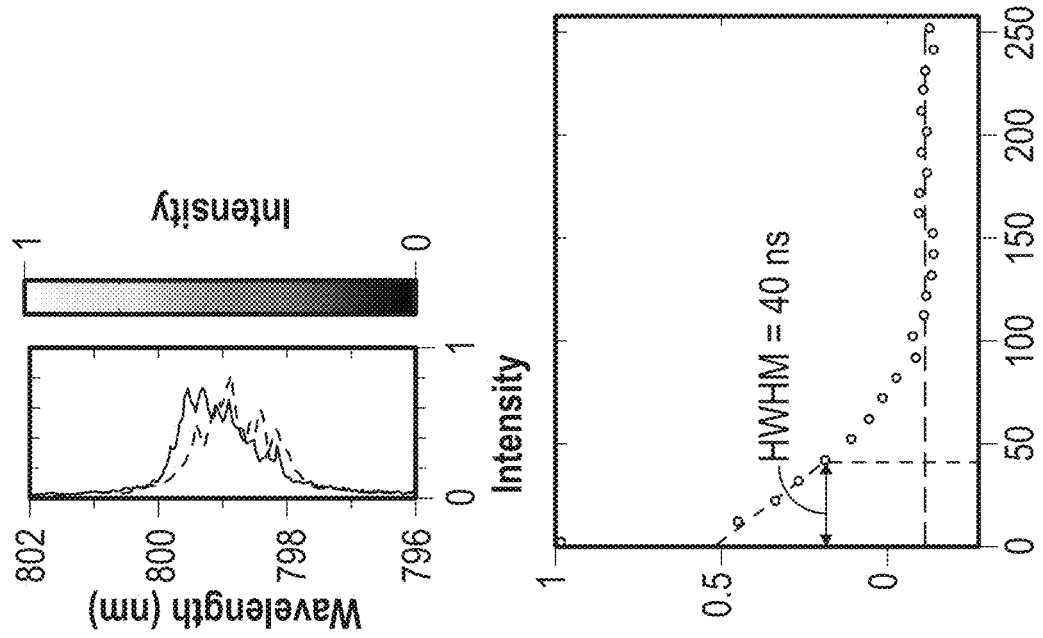
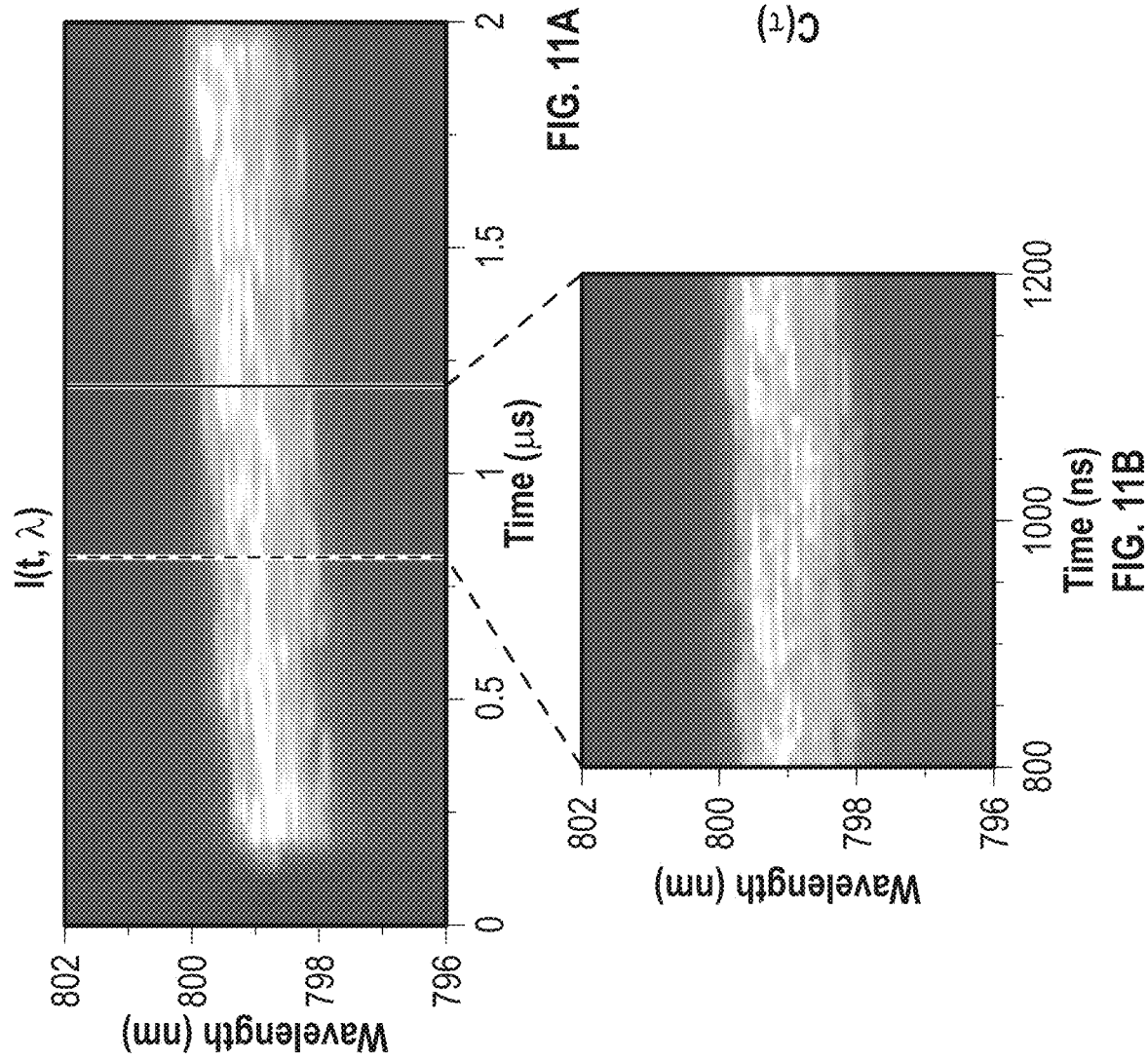
FIG. 11A
FIG. 11B
FIG. 11C

SYSTEMS AND METHODS FOR CHIP-SCALE LASERS WITH LOW SPATIAL COHERENCE AND DIRECTIONAL EMISSION

CROSS-REFERENCE TO RELATED APPLICATION

This application claims priority to U.S. Provisional Application No. 62/877,916, filed Jul. 24, 2019, the entire contents of this application being incorporated herein by reference.

GOVERNMENT RIGHTS

This invention was made with government support under N00014-13-1-0649 awarded by United States Office of Naval Research and under FA9550-16-1-0416 awarded by United States Air Force Office of Scientific Research. The government has certain rights in the invention.

BACKGROUND

The high spatial coherence of conventional lasers can introduce coherent artifacts due to uncontrolled diffraction, reflection, and optical aberration. A common example is speckle formed by the interference of coherent waves with random phase differences. Speckle noise is detrimental to full-field imaging applications such as displays, microscopy, optical coherence tomography, and holography. It also poses as a problem for laser-based applications like material processing, photolithography, and optical trapping of particles.

SUMMARY

Exemplary embodiments of the present disclosure advantageously address problems associated with poor directionality and/or high spatial coherence from random or chaotic cavity laser sources. Systems and methods described herein include on-chip semiconductor laser sources that produce directional beams with low spatial coherence. The lasing modes are based on an axial orbit in a stable cavity and have good directionality. To reduce the spatial coherence of emission, the number of transverse lasing modes can be increased by fine-tuning the cavity geometry in accordance with embodiments of the present disclosure. Decoherence can be reached in nanoseconds. Such rapid decoherence can facilitate applications of embodiments of the semiconductor lasers described herein in ultrafast speckle-free full-field imaging.

Systems and methods of the present disclosure include compact electrically-pumped semiconductor lasers. By optimizing the shape of an on-chip near-concentric cavity, the number of transverse lasing modes output by the laser can be increased and speckle formation can be suppressed. Low speckle contrast is obtained even for an integration time of a few nanoseconds. In conventional spatially-incoherent non-modal emission from a broad-area vertical-cavity surface-emitting laser, adjustment of the pump conditions constantly modifies the cavity due to thermal effects to disrupt the formation of lasing modes and cause spatially incoherent emission. The approach described herein does not rely on thermal effects, and the decoherence time of systems and methods of the present disclosure is two orders of magnitude shorter than for conventional systems. Furthermore, systems and methods described herein do not utilize transient processes and are thus applicable to steady-state lasing. In some embodiments, lasers of the present disclosure can operate under constant pumping to emit a continuous wave having low spatial coherence.

A chip-scale laser device is provided. The chip-scale laser device includes a substrate and a laser cavity on the substrate. The laser cavity includes cladding layers and a gain medium embedded in a guiding layer. The laser cavity has a first end wall and a second end wall. A shape of the first end wall and the second end wall is defined to cause the chip-scale laser device to emit light with low spatial coherence and high directionality. In some embodiments, the shape of the first end wall and the second end wall creates a near-concentric cavity. In some embodiments, a decoherence time for a laser beam produced by the chip-scale laser device is in a range from 100 picoseconds to 500 nanoseconds. In some embodiments, speckle contrast for a laser beam produced by the chip-scale laser device is less than 0.03.

In some embodiments, a ratio of the length of the laser cavity and a width of the laser cavity is equal to about a square root of two. In some embodiments, the shape of the first end wall and the second end wall cause the laser cavity to have a cavity stability parameter in a range from $-0.6$ to $-0.8$. In some embodiments, laser emission from the chip-scale laser device has a half-width at a half-maximum divergence angle in a range from 20 degrees to 50 degrees in a far field. In some embodiments, the chip-scale laser device is a semiconductor laser. In some embodiments, the chip-scale laser cavity is tuned to provide near degeneracy for Q-factors for transverse modes.

In some embodiments, the chip-scale laser device includes a pair of electrodes that electronically pump the gain medium. In some embodiments, the laser cavity produces continuous wave light output. In some embodiments, the gain medium comprises gallium arsenide. In some embodiments, the guiding layer comprises aluminum gallium arsenide.

A method of manufacturing a chip-scale laser device is provided. The method includes forming a body on a substrate. The body includes cladding layers and a gain medium embedded in a guiding layer. The method includes forming a first end wall and a second end wall of a laser cavity in at least a portion of the body. a shape of the first end wall and the second end wall enables the chip-scale laser device to emit light with low spatial coherence and high directionality. In some embodiments, the method includes disposing a back contact on a back surface of the substrate. In some embodiments, forming the first and second end walls includes shaping the first end wall and the second end wall to create a near-concentric cavity. In some embodiments, the method includes defining a length of the laser cavity and a width of the laser cavity to have a ratio between the length and the width that is equal to about a square root of two.

In some embodiments, forming the first and second end walls includes shaping the first end wall and the second end wall such that the laser cavity has a cavity stability parameter in a range from $-0.6$ to $-0.8$. In some embodiments, forming the first and second end walls includes shaping the first end wall and the second end wall such that the laser cavity is tuned to provide near degeneracy for Q-factors for transverse modes. In some embodiments, the method can include defining the shape of the laser cavity in a photoresist layer disposed on a silicon dioxide layer disposed on the body using photolithography and transferring the shape of the laser cavity to the silicon dioxide layer. The method can include removing the remaining photoresist layer and forming the laser cavity in the body by dry etching using the silicon dioxide layer as a mask. The method can include removing the silicon dioxide layer.

BRIEF DESCRIPTION OF THE DRAWINGS

In the drawings, like reference numerals refer to like parts throughout the various views of the non-limiting and non-exhaustive embodiments.

FIG. 1 illustrates an exemplary semiconductor laser device having low spatial coherence and producing directional laser emission in accordance with embodiments described herein.

FIG. 9A illustrates an experimentally measured speckle pattern from a near-concentric cavity laser of an embodiment of the laser devices described herein.

FIG. 9B illustrates an experimentally measured speckle pattern for a conventional high spatial coherence laser device using the same optical setup as was used in FIG. 9A.

FIG. 11A shows an experimentally measured spectrochronogram $I(t,\lambda)$ of a near-concentric cavity (g=−0.74) laser according to some embodiments at a pump current of two times the lasing threshold.

FIG. 11B shows a portion of the spectrochronogram of FIG. 11A at higher resolution.

FIG. 11C is a graph that illustrates the autocorrelation function $C(\tau)$ of the time-resolved spectra in FIG. 11B.

DETAILED DESCRIPTION

Figure 2A:
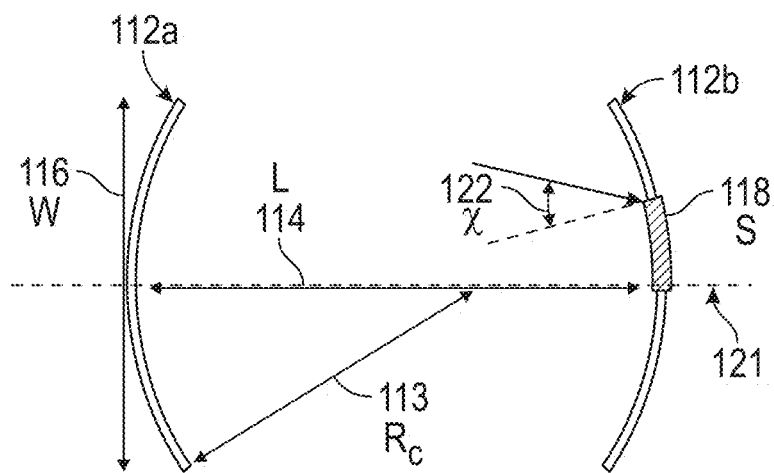
FIG. 2A illustrates cavity parameters for laser devices in accordance with embodiments of the present disclosure.

Various approaches to mitigate speckle artifacts have been developed. A traditional method is to average over many independent speckle patterns generated by a moving diffuser, colloidal solution, or fast scanning micromirrors. However, the generation of a series of uncorrelated speckle patterns is time-consuming and limited by the mechanical speed. A more efficient approach is to design a multimode laser that generates spatially incoherent emission, thus directly suppressing speckle formation. Low spatial coherence necessitates lasing in numerous distinct spatial modes with independent oscillation phases. For example, a degenerate cavity allows a large number of transverse modes to lase, but the setup is bulky and hard to align. Complex lasers with compact size such as random lasers have low spatial coherence and high photon degeneracy, but are typically only optically pumped. For speckle-free imaging applications, wave-chaotic semiconductor microlasers have the advantages of electrical pumping and high internal quantum efficiency. However, conventional disordered or wave-chaotic cavity lasers typically have no preferential emission direction, and the poor collection efficiency greatly reduces their external quantum efficiency. Systems and methods described herein include semiconductor lasers. Embodiments of the semiconductor lasers can be electrically pumped multimode semiconductor microlasers without a disordered or wave-chaotic cavity to achieve low spatial coherence and directional emission.

The chip-scale lasers described herein and systems and methods associated with the chip-scale lasers can suppress laser speckle at very high speeds, which can be important in imaging applications. For instance, time-resolved optical imaging to observe fast dynamics (e.g., cellular dynamics) requires speckle-free image acquisition with a short integration time, and the oscillation phases of different spatial lasing modes must thus decorrelate during the integration time to attain decoherence. The finite linewidth $\Delta v$ of individual lasing modes leads to decoherence on a time scale of $1/\Delta v$. The frequency difference between different lasing modes can lead to even faster decoherence. For example, the emission from many random lasing modes with distinct frequencies already exhibits low spatial coherence within ten nanoseconds. In conventional solid-state degenerate cavity lasers, the intensity contrast of laser speckle is reduced by the dephasing between different longitudinal mode groups in tens of nanoseconds, but complete decoherence requires a few microseconds due to the small frequency spacing between transverse modes. Embodiments of the semiconductor lasers and associated systems and methods described herein can achieve fast decoherence times by utilizing large mode spacings.

In traditional large-scale degenerate cavities using mirrors as reflectors, the cavities are bulky and do not exhibit reflectivity that varies with angle. In embodiments of chip-scale laser devices described herein, the cavity size is greatly reduced (i.e., dimensions less than 1 mm) as compared to previous bulky cavities. However, chip-scale cavities using etched facets typically exhibit angle-dependent reflectivity. The angle-dependent reflectivity of the etched facet prevents oscillation within the confocal cavity of many nearly-degenerate transverse modes which, in turn, limits reductions in spatial coherence. Here, systems, methods, and devices described herein tune the cavity shape based upon the gain medium and material properties to maximize the number of transverse modes that will lase. As such, the challenges associated with angle-dependent reflectivity at etched facets are overcome.

As used herein, "chip-scale" indicates devices and device features fabricated to have dimensions less than 1 mm similar to those fabricated using semiconductor wafer processing techniques. As a non-limiting example, chip-scale devices can have features and/or dimensions on a scale approximately ranging from nanometers to tens or hundreds of micrometers.

As used herein, "near degenerate" indicates a laser cavity having a shape that optimizes the number of transverse modes having a Q-factor above a threshold value while lifting the frequency degeneracy of the transverse modes to reduce the decoherence time. For example, a near degenerate cavity in some embodiments may produce a high number of transverse modes having Q-factors equal to at least $0.8*Q_{max}$ wherein $Q_{max}$ is the maximum Q-value for any transverse mode.

As used herein, "near concentric" indicates a shape that slightly deviates from a concentric shape (i.e., the stability factor g is close to −1) such that mode profiles are laterally localized to the cavity axis. In accordance with some embodiments, a cavity having a near concentric shape is tuned to provide near-degeneracy of Q-factors for many transverse modes which, in turn, improves the number of transverse lasing modes and lowers the spatial coherence of the emission. In various embodiments described herein, the optimal cavity shape may not be near-concentric but can have any value for g in a range from 0 to −1 based upon factors such as the refractive index of the cavity and the gain material.

The present disclosure relates to systems and methods for chip-scale lasers with tuned cavity shape for near degeneracy of Q-factors in transverse modes. Such systems and methods for reducing spatial coherence while retaining directional emission as described herein can apply to chip-scale laser devices using a wide variety of laser gain media. For example, the laser device can include solid-state, organic, polymer, or semiconductor materials as all or part of the gain medium. In the present systems and methods, the cavity shape g is tuned to reach near-degeneracy of Q-factors for the transverse modes which, in turn, improves the number of transverse lasing modes and lowers the spatial coherence of the resulting emission.

FIG. 1 illustrates an exemplary chip-scale laser device 100 having low spatial coherence and producing directional laser emission in accordance with embodiments described herein. In an example embodiments, the chip-scale laser device 100 can be a semiconductor laser device 100. While example embodiments are described with respect to a non-limiting example involving semiconductor technology using Gallium Arsenide (GaAs) illustrate the principles of the present disclosure, exemplary embodiments of the systems, methods, and apparatus described herein are not limited to GaAs or other semiconductor technologies as the principles can apply to chip-scale lasers having a broad range of gain media. The chip-scale laser device 100 can include a laser cavity 102 including cladding layers 103 and a gain medium embedded in a guiding layer 104, a top contact 110, and a back contact 105. A shape of each of the end walls 112a, 112b (interchangeably referred to herein as mirrors or facets) of the laser cavity 102 is carefully formed to promote axial orbits 120 and inhibit non-axial orbits. In some embodiments, the end walls 112a, 112b have an angle-dependent reflectivity, i.e., the reflectivity of the end wall depends on the angle at which a light ray strikes the wall as measured with respect to the surface normal (as shown in FIG. 2A). Some embodiments of the chip-scale laser device 100 described herein select the shape of the end walls to counteract the effects of this angle-dependent reflectivity to enable many transverse modes to oscillate within the laser cavity 102. The chip-scale laser device 100 can be an on-chip stable cavity laser with directional emission. The lasing modes of the laser cavity 102 are based on axial orbits and thus have directional emission. In some embodiments, the shape of the top contact 110 matches the spatial profile of high-order transverse modes to ensure their spatial overlap with gain regions in the laser cavity 102.

In some embodiments, the gain medium can be a 12 nm-thick GaAs quantum well, embedded in the middle of an undoped 400 nm-thick $Al_{0.37}Ga_{0.63}As$ guiding layer (e.g., guiding layer 104), which itself can be disposed between p-doped and n-doped $Al_{0.55}Ga_{0.45}As$ cladding layers (each is 1.5 μm thick) (e.g., cladding layers 103) to form a body. This body, which includes the cladding and guiding layers and the gain medium, is the medium in which the laser cavity is defined. The body of the chip-scale laser device 100 can be disposed upon a diode laser wafer (e.g., Q-Photonics QEWLD-808). Although the present chip-scale laser device 100 is described based upon GaAs quantum well laser technology, one of ordinary skill in the art would appreciate that other technologies can be used including GaN semiconductor technologies and other non-semiconductor technologies developed for laser devices that utilize different gain materials.

In some embodiments, the laser cavity 102 can be fabricated using the following procedure. First, the back contact 105 can be deposited on a back side of a substrate 101 and thermally annealed at 390° C. for 30 s. The back contact 105 can be formed of multiple layers. For example, the back contact 105 can be formed of Ni/Ge/Au/Ni/Au layers. In an exemplary embodiment, the thicknesses of the Ni/Ge/Au/Ni/Au layers are 5/25/100/5/200 nm, respectively. Then a 300 nm-thick $SiO_2$ layer can be deposited on a front side of the substrate and body. The shape of the laser cavity 102 can be defined by photolithography and can be transferred to the $SiO_2$ layer by reactive ion etching (RIE) with a $CF_4$ (30 sccm) and $CHF_3$ (30 sccm) mixture. After the removal of the photoresist, the remaining $SiO_2$ can be used as a mask for inductively coupled plasma (ICP) dry etching with an Ar (5 sccm), $Cl_2$ (4 sccm), and $BCl_3$ (4.5 sccm) plasma mixture to create the laser cavity 102 in at least a portion of the body. In some embodiments, the etch depth is about 4 μm to etch all the way through the guiding layer 104 and partially into the bottom cladding layer 103. After the ICP dry etching, the $SiO_2$ mask can be removed by RIE and a buffered oxide etch (BOE).

In some embodiments, the top contact 110 can be formed of metal. The top contact 110 can be defined using negative photolithography followed by metal deposition. In different embodiments, the top contact 110 can be formed on the body before the laser cavity 102 is defined or can be formed after the laser cavity 102 is defined. In an exemplary embodiment, titanium and gold (thicknesses 20/200 nm, respectively) are deposited. In some embodiments, the boundaries of the top contact can be located at a recessed position with respect to the end walls 112a, 112b. For example, the boundaries of the top contact 110 can be located 5 μm away from the cavity end walls 112a, 112b to prevent the top contact 110 from hanging down and blocking emission from the facets of the laser device 110. In some embodiments, a final step includes lift-off, after which an embodiment of the fabricated chip-scale laser device 100 can be cleaned by $O_2$ plasma.

FIG. 2A illustrates features of the laser cavity 102. In some embodiments, the laser cavity can be a two-dimensional (2D) symmetric stable cavity defined by two concave circular mirrors 112a, 112b with radius of curvature $R_c$ 113 defining a cavity width W 116 and separated by a distance L 114 along a cavity axis 121. Rays impinging on the end walls 112a, 112b are described by coordinates (s, X), where s is the coordinate along the curved boundary 118, and X is the angle of incidence 122 with respect to the surface normal of the end walls 112a, 112b.

Figure 2B:
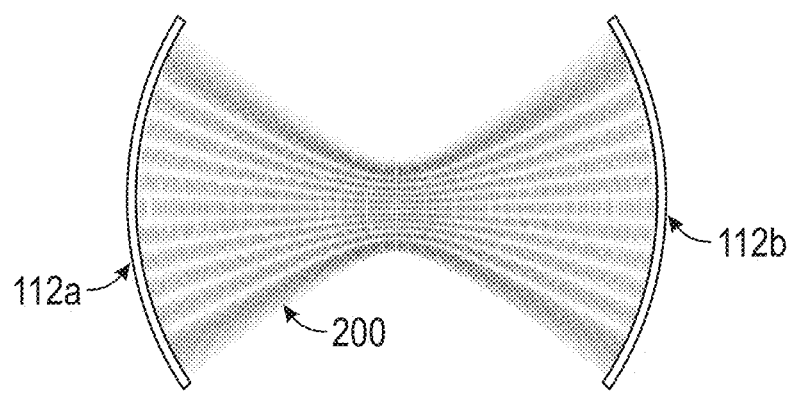
FIG. 2B shows a simulated spatial intensity profile of a high-order transverse mode with m=10 in a cavity of embodiments of the present disclosure.

The emission from conventional broad-area semiconductor lasers with flat end mirrors exhibits good directionality. However, lasing occurs only in a few transverse modes because high-order transverse modes have large divergence angles and hence experience severe losses. To lower the spatial coherence of embodiments of the laser device 100, the laser device 100 is fabricated to increase the number of transverse lasing modes as compared to conventional semiconductor lasers. By fabricating the laser device 100 with curved end mirrors 112a, 112b, the losses of high-order transverse modes can be reduced. The laser cavity 102 can include two-dimensional (2D) symmetric cavities with two circular concave mirrors 112, 112b with radius of curvature $R_c$ 113 as shown in FIG. 2A. The mirrors 112a, 112b are oppositely spaced with their concave surfaces facing each other. The mirrors 112a, 112b can be separated by the cavity length L 114. The geometry of the cavity is determined by a cavity stability parameter (g) expressed mathematically as $g=1-L/R_c$. If the radius of curvature, $R_c$, is larger than cavity length divided by two (L/2), or cavity stability parameter, g, is within the range (−1, 1), the cavity is stable in the sense that rays starting near the axial orbit 120 stay close to the axial orbit and remain inside the cavity. In the paraxial limit, the resonances in the stable cavity 102 are described by Hermite-Gaussian modes, which have different transverse profiles depending on the transverse mode number m. FIG. 2B shows the spatial intensity profile 200 of a high-order transverse mode with m=10.

Figure 2C:
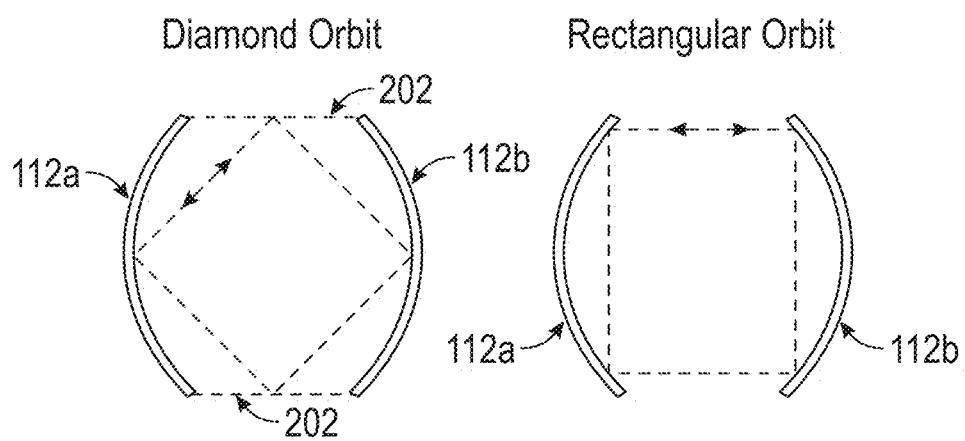
FIG. 2C schematically illustrates non-axial modes in a laser cavity in accordance with embodiments of the present disclosure.

Reducing speckle contrast to below the level of human perception≈0.03 can require 1000 transverse modes to lase simultaneously and independently. Conventional stable cavity semiconductor lasers with curved facets (end walls) typically exhibit less than 10 transverse lasing modes. To accommodate higher order transverse modes, in accordance with embodiments of the present disclosure, the cavity width W can be increased. However, modes based on non-axial orbits can appear in wide cavities, yielding non-directional emission. Two exemplary non-axial modes are illustrated in FIG. 2C. To ensure directional emission, some embodiments can include cavity shape designs such that all lasing modes are based on the axial orbit 120. In some embodiments, exemplary laser devices 100 as described herein produce laser beams with speckle contrast below 0.03. Embodiments of the laser device 100 can be fabricated to have a speckle contrast below 0.03 for continuous wave or pulsed laser sources over different integration times.

In some embodiments, the laser cavity 120 can include non-reflecting surfaces at the lateral sides 202 (opposing each other and adjacent to the end walls 112a, 112b) to suppress non-axial modes based on the periodic orbits with bounces from the sidewalls, such as the diamond orbit. In some embodiments, the cavity width 116 can be fabricated to be the quotient of the cavity length L divided by the square root of 2, which can be expressed mathematically as $W=L/\sqrt{2}$, to prevent formation of rectangle orbits in the stable cavity 120 of an embodiment of the laser device 100.

To maximize the number of high-Q transverse modes, the cavity shape 120 of an embodiment of the laser device 100 can be optimized by fine tuning radius of curvature $R_c$ 113 while keeping cavity length L 114 and cavity width W 116 fixed. The passive cavity modes can be numerically calculated using, e.g., the finite element method. To illustrate an embodiment of the laser device 100, a 2D cavity with the cavity length L=20 μm is simulated. The refractive index of the cavity n=3.37 corresponds to the effective refractive index of the vertically guided mode of a GaAs wafer. Transverse-electric (TE) polarization (electric field parallel to the cavity plane) is considered in the simulation since GaAs quantum wells have higher gain for this polarization and the lasing modes are TE polarized.

Figure 3A:
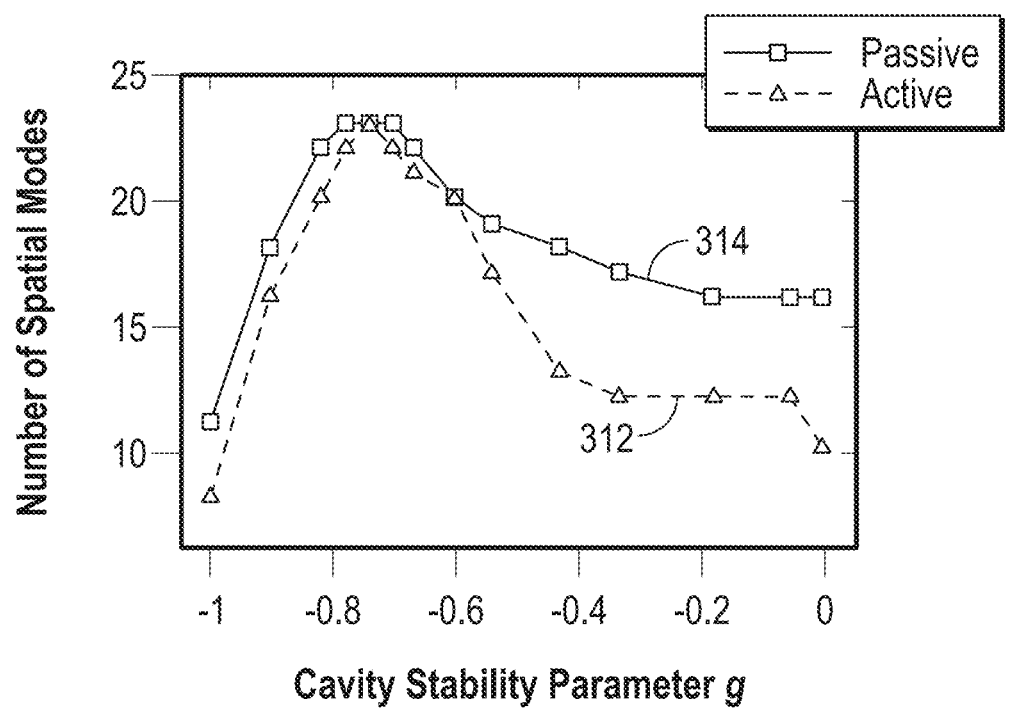
FIG. 3A is a graph that illustrates the results of a simulation of the number of high-Q passive modes (squares) and the number of lasing modes (triangles) based on axial orbits for different values of the cavity stability parameter in accordance with embodiments of the present disclosure.
Figure 3B:
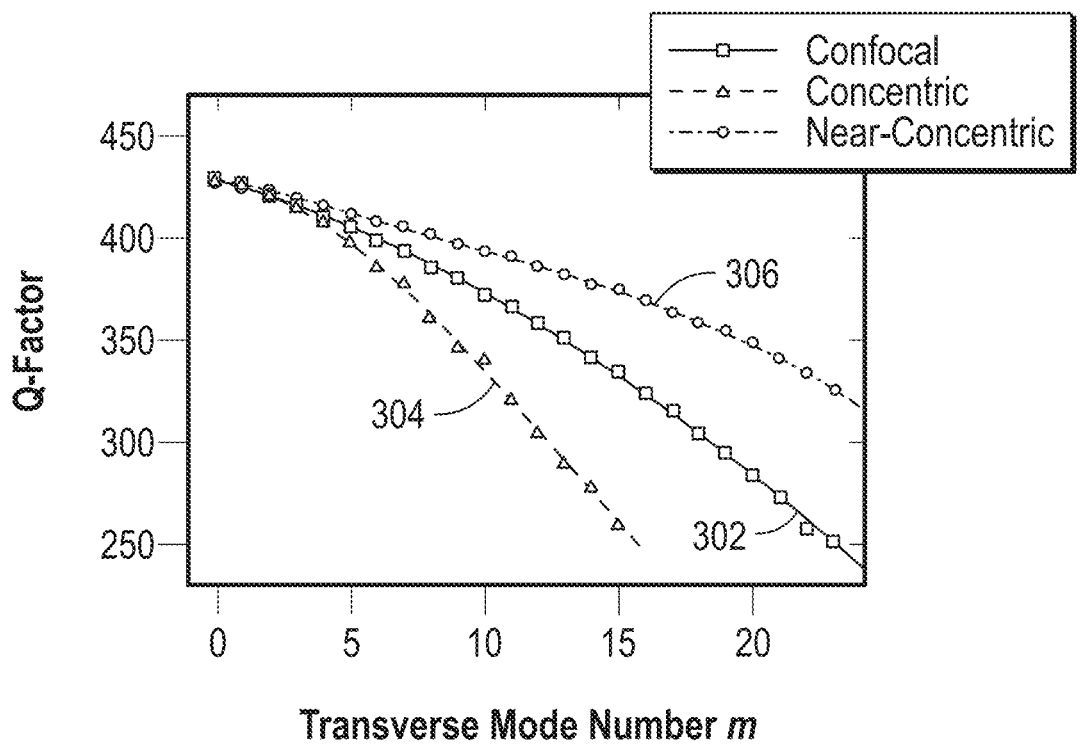
FIG. 3B is a graph that illustrates the results of a simulation of the dependence of quality factor Q on transverse mode number m for different cavity shapes in accordance with embodiments of the present disclosure.

FIG. 3A illustrates the number of high-Q passive modes (squares, plot 314) and the number of lasing modes (triangles, plot 312) that are based on axial orbit and exhibit distinct transverse profiles. FIG. 3B illustrates the dependence of quality factor Q on transverse mode number m for the optimized near-concentric (g=−0.74, plot 306), confocal (g=0, plot 302), and concentric (g=−1, plot 304) cavities. Degenerate cavities with conventional mirrors can support transverse modes with nearly-degenerate Q-factors based on their self-imaging property. The confocal geometry (g=0) is an example of a degenerate cavity. As shown in FIG. 3B, the Q-factor decreases significantly as the transverse mode number m increases in an on-chip design with dielectric interfaces as end mirrors 112a, 112b as shown in plot 302.

Figure 3C:
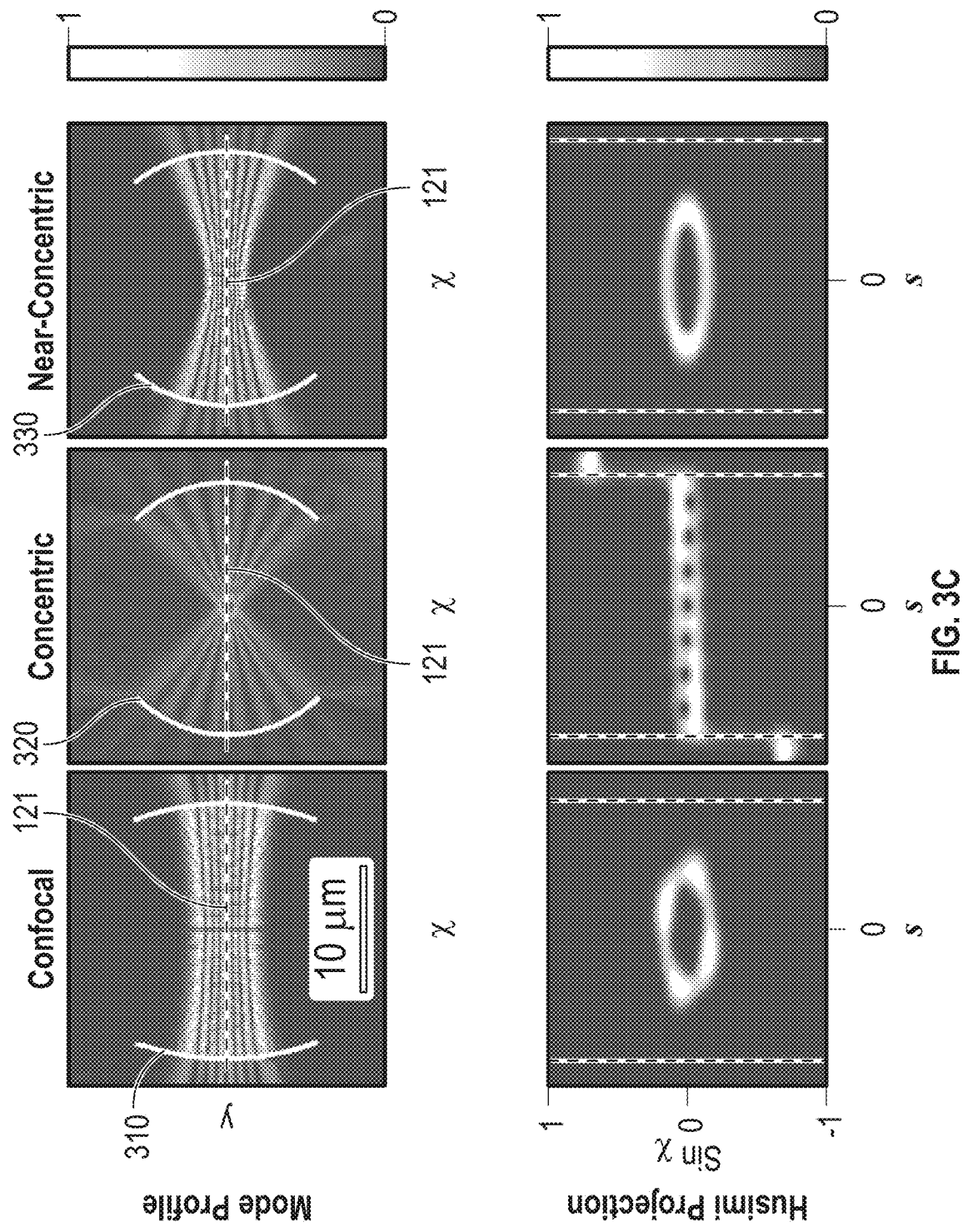
FIG. 3C illustrates calculated spatial distributions of field amplitude (along the top row) and corresponding Husimi projections (along the bottom row) for high-order transverse modes (m=7) in cavities of different values of g in accordance with embodiments of the present disclosure.

FIG. 3C illustrates calculated spatial distributions of field amplitude (top row in FIG. 3C) and corresponding Husimi projections (bottom row in FIG. 3C) for high-order transverse modes (m=7) in cavities of different values of g corresponding to a confocal cavity 310, a concentric cavity 320, and a near-concentric cavity 330. The white solid lines in the top row represent the curved cavity end walls, and the dashed lines in bottom row mark the endpoints of the end walls. For the confocal cavity 310, FIG. 3C shows a typical mode laterally confined to the cavity axis 121, resulting in negligible diffraction loss. However, its Husimi projection, which visualizes the angle of incidence of wave components on different parts of the cavity boundary, features high-intensity spots at nonzero incident angle X. As the number of lasing modes m increases, wave components with increasingly higher incident angles appear. Thus high-order transverse modes in the confocal cavity experience higher loss since the reflectivity at a dielectric-air interface decreases with increasing X for TE-polarized light, making the confocal cavity unsuitable for multimode lasing.

An alternative to a confocal geometry is the concentric cavity 320 (g=−1). Since the concentric mirrors are part of a circle, any ray passing through the cavity center hits the end walls perpendicularly. Indeed, the Husimi projection for the concentric geometry 320 (shown in FIG. 3C) is strongly localized at X=0 and, thus, the angle-dependent reflectance is an insignificant loss mechanism. However, as the mode profile exhibits a large divergence, light leaks out via diffraction from the endpoints of the end walls. These losses are evident in the Husimi projection from the appearance of high-intensity spots just outside the cavity end walls. Since the higher order transverse modes experience stronger diffraction loss, the Q-factor decreases even more quickly with m than for the confocal case as seen in plot 304 in FIG. 3B.

Simulations were conducted to vary g from −1 to 0 in search of a geometry that supports a large number of high-Q transverse modes. FIG. 3A shows the number of transverse modes based on the axial orbit 120 that have Q-factors exceeding 0.8 times the maximal Q-factor, as a function of g. Both active modes (plot 312) and passive modes (plot 314) are illustrated. In some embodiments, the shape of the end mirrors 112a, 112b of the laser cavity 102 of an embodiment of the laser device 100 provide a cavity stability parameter in a range from −0.6 to −0.8. The curves peak at a cavity stability parameter of g=−0.74, which is near concentric. In some embodiments, the laser cavity 102 has end walls 112a, 112b that provide a near concentric shape. In some embodiments, the end walls 112a, 112b of the laser cavity 102 provide a cavity stability factor of −0.74.

As shown in FIG. 3C, a slight deviation from the concentric shape (i.e., the near-concentric shape 330) makes the mode profiles laterally localized to the cavity axis. Moreover, the Husimi projection shows high-intensity spots centered at X=0, which indicates most wave components have almost normal incidence on the cavity facet. Therefore, the near-concentric geometry minimizes both losses from angle-dependent reflectance and diffraction, resulting in the slowest decrease of Q with m. As the number of transverse modes scales linearly with the width W of the cavity when keeping the ratio W/L fixed, we can apply this optimization result to the larger cavities used in experiments.

The cavity resonances can be calculated with the COMSOL eigenfrequency solver module. The cavity resonances are solutions of the scalar Helmholtz equation expressed mathematically as follows:

$$[\nabla^2 + k^2 n^2(x,y)] H_z(x,y) = 0 \quad \text{(Equation 1)}$$

with outgoing wave boundary conditions where k is the free-space wave number and $H_z$ is the z-component of the magnetic field. In this exemplary simulation, the cavity length is L=20.0 μm and the transverse width W=L/√2=14.1 μm, which is the maximum width to avoid the rectangle orbit as described above. To fine-tune the cavity geometry in this simulation, only the radius of curvature $R_c$ of the end mirrors was adjusted from 10 μm (concentric, g=−1) to 20 μm (confocal, g=0), while L and W were kept constant. The resonant modes are obtained in a spectral range centered at $\lambda_0$=800 nm, which is the approximate lasing emission wavelength in this simulation.

Figure 4A:
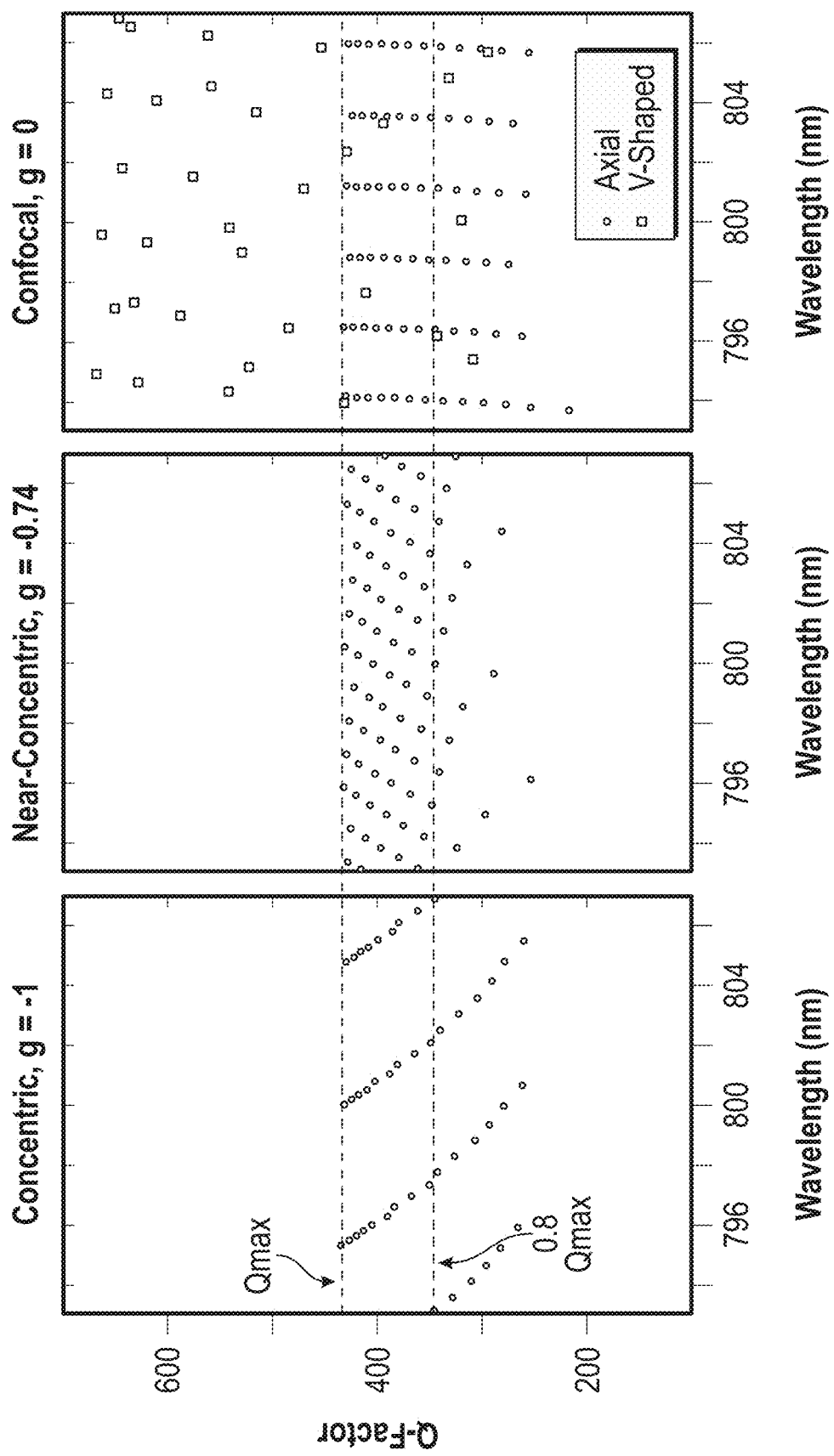
FIG. 4A illustrates three graphs showing calculated quality factors and wavelengths of resonances for high-Q modes for different cavity shapes in accordance with embodiments of the present disclosure.

FIG. 4A illustrates calculated quality factors and wavelengths of resonances for high-Q modes for exemplary concentric (g=−1), near-concentric (g=−0.74), and confocal (g=0) cavities. The upper dashed lines indicate the maximum Q factor $Q_{max}$. The lower dashed line is 0.8 $Q_{max}$, the lower limit of high-Q modes that were considered. Blue dots represent modes based on the axial orbit 120 and red squares represent modes based on non-axial orbits. The numerically calculated mode wavelengths agree well with the analytic expression for the frequencies of Hermite-Gaussian modes, expressed mathematically as follows:

$$v_{m,q} = \frac{c}{2nL}\left[q + \frac{1}{\pi}\left(m + \frac{1}{2}\right)\arccos(g)\right] \quad \text{(Equation 2)}$$

where v=c/λ is the frequency, c is the speed of light, n is the refractive index, L is the cavity length, g is the cavity stability parameter, and (q, m) are the longitudinal and transverse mode numbers, respectively. The deviations between numerical and analytic mode wavelengths gradually grow as m increases and reach 0.04% for the highest-order high-Q transverse mode (m=23) in the near-concentric cavity. The deviations are larger for the concentric cavity (g=−1), since it is at the border of the stability region where Eq. 2 no longer holds. The fundamental transverse Hermite-Gaussian modes (m=0) have the highest Q-factors $Q_{max}$=433, which is equal to the Q-factor of a Fabry-Perot cavity with length L, $$Q_{max} = \frac{2\pi v n L}{c}\ln(1/R) \quad \text{(Equation 3)}$$

where v is the vacuum frequency and $R=[(1-n)/(1+n)]^2$ is the reflectivity of the cavity facet for normal incidence. The number of high-Q modes shown in FIG. 3A is given by the number of modes whose Q-factor is above 0.8 $Q_{max}$ (this range is marked by the horizontal dashed lines in FIG. 4A).

Figure 4B:
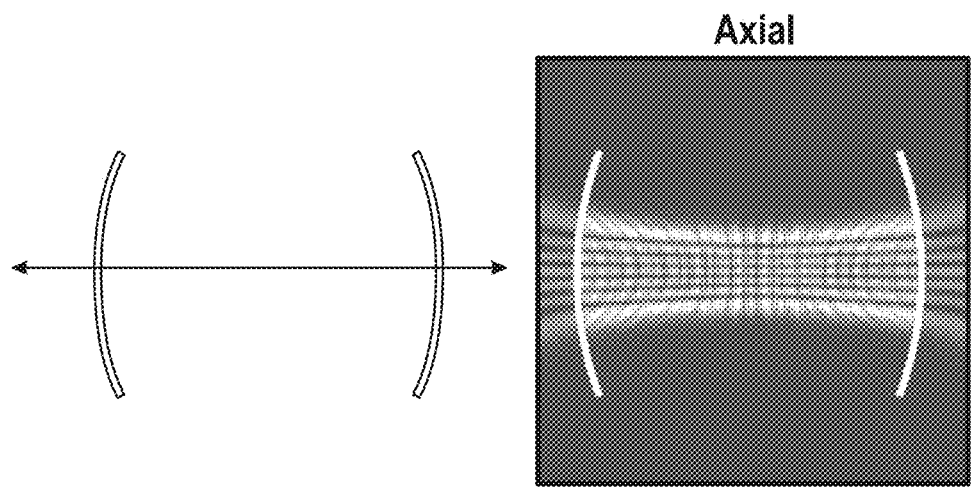
FIG. 4B illustrates an example of a simulated spatial intensity profile for modes based on the axial mode in accordance with embodiments of the present disclosure.
Figure 4C:
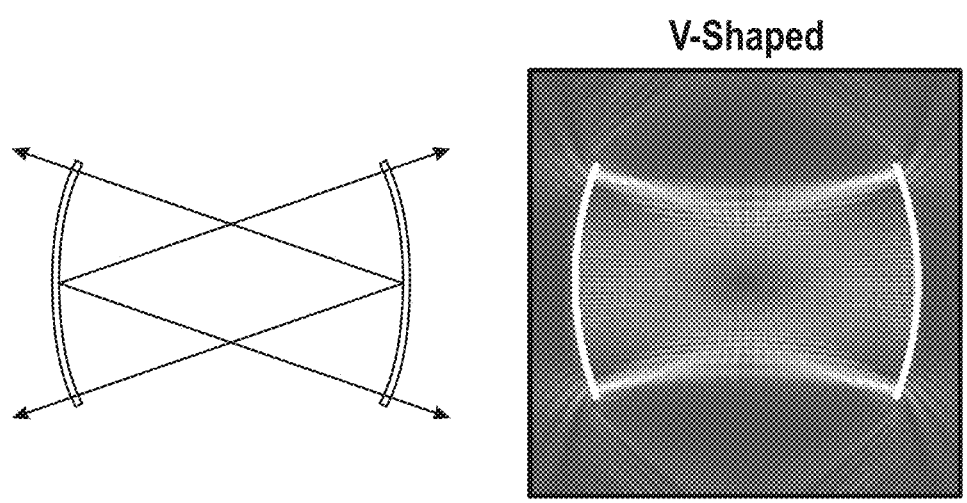
FIG. 4C illustrates an example of a simulated spatial intensity profile for modes based on the non-axial, V-shaped orbit in accordance with certain embodiments in accordance with embodiments of the present disclosure.

In addition to the usual Hermite-Gaussian modes based on the axial orbit, modes based on V-shaped orbits (see FIG. 4A) exist in confocal (g=0) and near-confocal (g close to 0) geometries. FIG. 4B illustrates examples of modes based on the axial mode (left) and the non-axial, V-shaped orbit (right). Non-axial modes are indicated as red squares in FIG. 4A, and in most cases exhibit higher Q-factors than the axial modes since the V-shaped orbit experiences total internal reflection at one mirror facet. The number of high-Q modes in FIG. 3A refers only to the axial modes, excluding the non-axial orbits which are undesirable due to their non-directional output.

Gain competition can limit the number of lasing modes. In order to quantify the effect of gain competition, the number of lasing modes can be calculated at steady state.

Plot 312 (active modes) in FIG. 3A represents the number of different transverse lasing modes at a pump level of two times above the lasing threshold. In the confocal cavity, the number of lasing modes based on the axial orbit 120 is notably smaller than the number of high-Q passive modes due to the existence of non-axial modes with higher Q that lase first and saturate the gain for the axial modes. For the optimized near-concentric cavity, most of the passive transverse modes with high Q can lase, indicating gain competition is insignificant.

Figure 5:
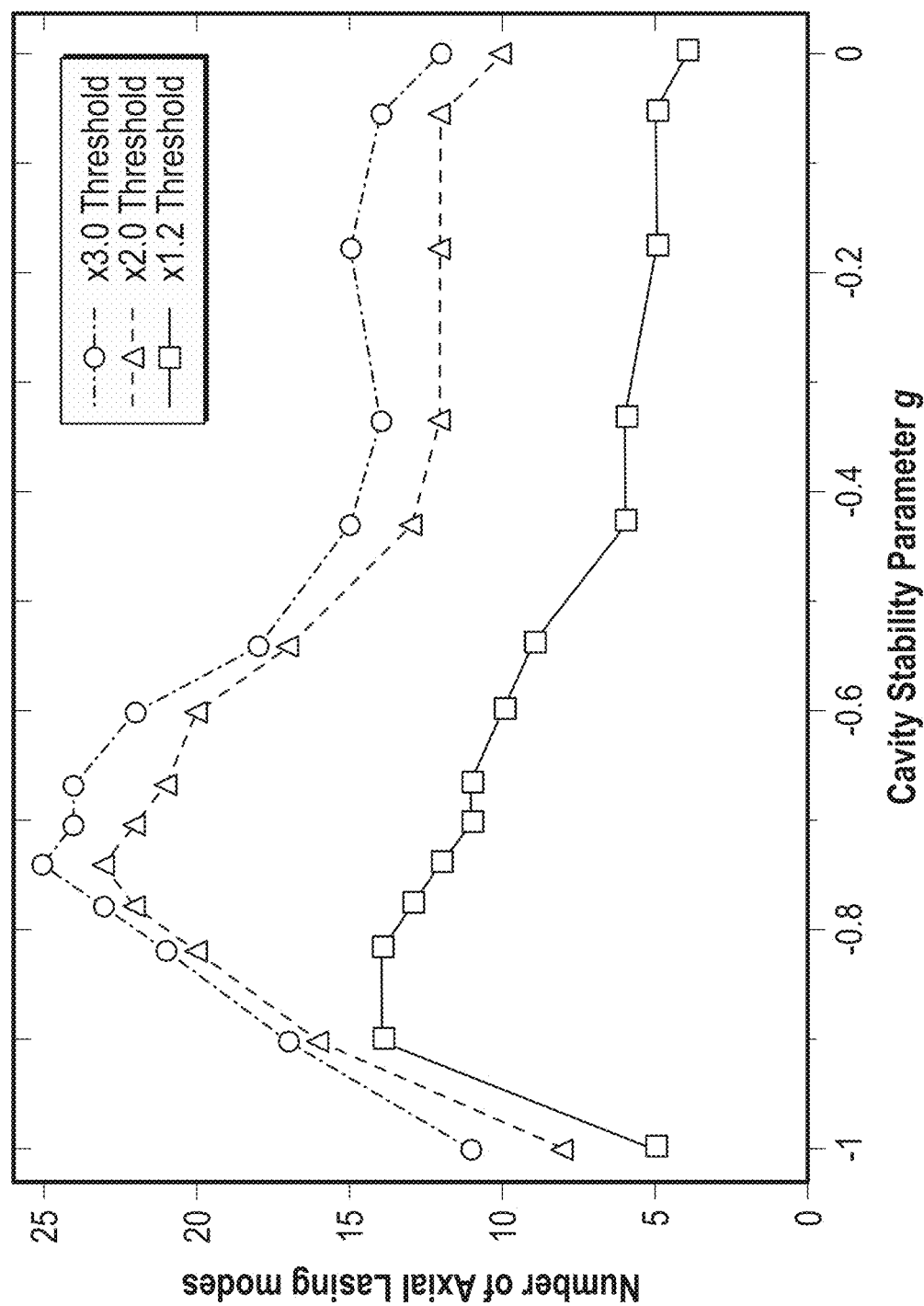
FIG. 5 is a graph that shows results derived from a simulation of the number of distinct transverse axial lasing modes at different pump levels as a function of cavity stability factor g in accordance with embodiments of the present disclosure.

The SALT (steady-state ab-initio laser theory) can be used to investigate the effect of mode competition in an active cavity. A spatially uniform distribution of pump and a flat gain spectrum are assumed. Both axial and non-axial modes are included in the simulations, and the presence of non-axial modes in the (near-) confocal cavities reduces the number of axial lasing modes, since the former have higher Q-factors than the latter. FIG. 5 shows the number of distinct transverse lasing modes at different pump levels as a function of cavity stability factor g, where only axial modes are counted. The pump level is defined with respect to the first lasing threshold of the axial modes. The maximum number of axial lasing modes is reached in the near-concentric regime of g close to −1. The optimal g value depends slightly on the pump level, but it remains at g=−0.74 when the pump exceeds twice the lasing threshold.

Figure 6A:
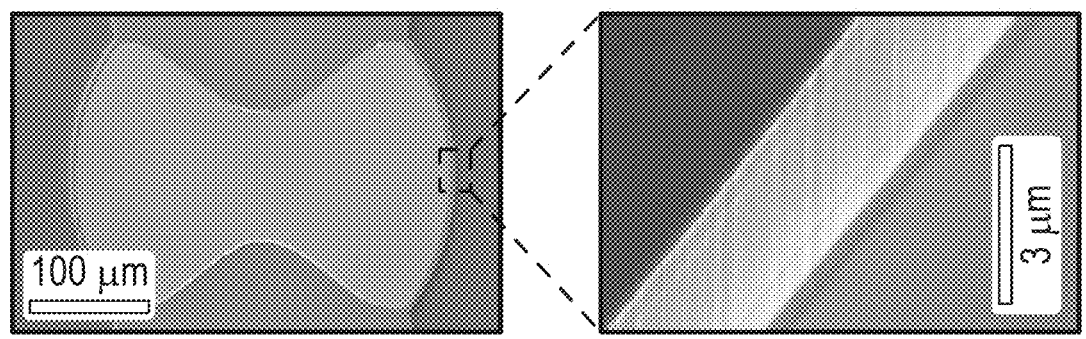
FIG. 6A illustrates scanning electron microscope (SEM) images of an embodiment of the laser device according to embodiments described herein.

FIGS. 6A-D illustrate experimental results for an embodiment of the chip-scale laser device 100 fabricated according to the principles described herein. FIG. 6A illustrates scanning electron microscope (SEM) images of the laser device 100 showing that the etched facets, which serve as curved end mirrors 112a, 112b, are smooth and vertical. For testing, the fabricated laser 100 was mounted on a copper block, and a tungsten needle (Quater Research, H-20242) was placed on the top contact 110 for current injection. The lasers were pumped electrically by a diode driver (DEI Scientific, PCX-7401), which generated a series of rectangular current pulses.

Figure 6B:
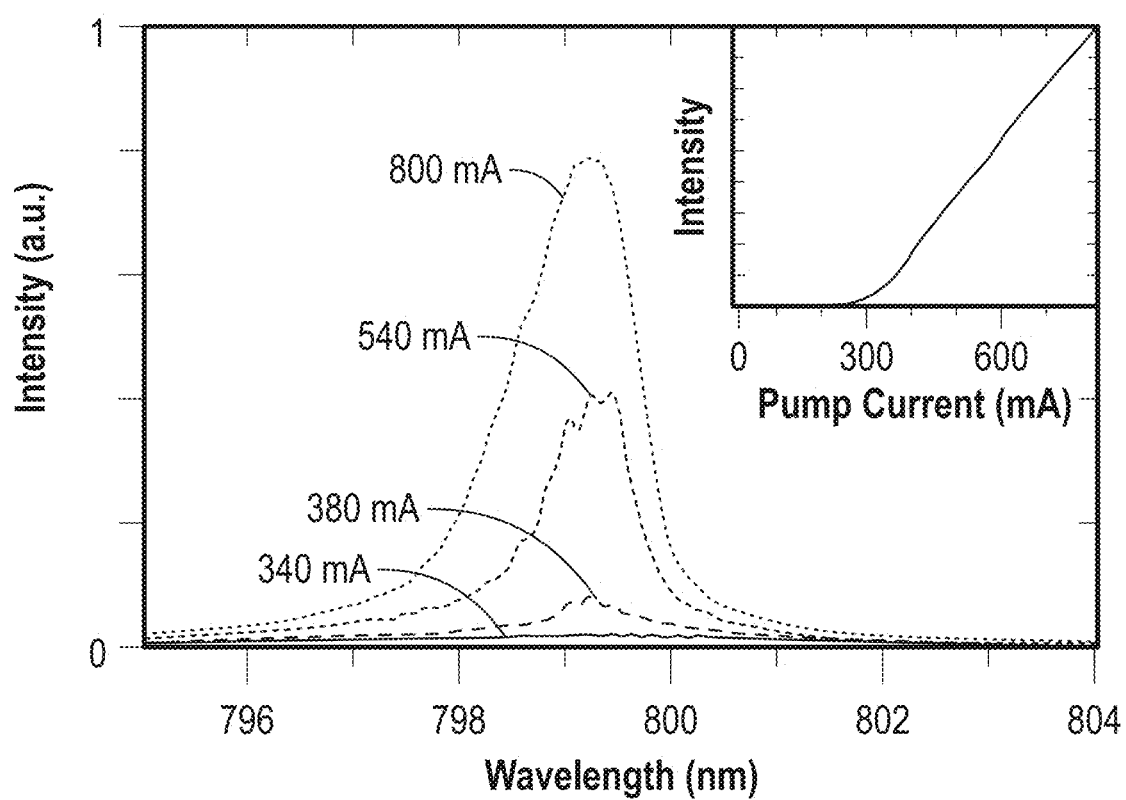
FIG. 6B is a graph that shows experimentally measured emission spectra from an embodiment of the laser device as disclosed herein at different pump currents.

Lasing was observed at room temperature with electrical pumping for all tested cavities including different sizes and shapes. To reduce heating, the current pulses used were 2 μs-long with 10 Hz repetition rate. The emission was collected by an objective lens (NA=0.4) and coupled into a spectrometer. FIG. 6B shows the emission spectra from the laser device 100 having a near-concentric cavity 102 (g=−0.74) at different pump currents. A typical spectrum consists of many closely-spaced narrow peaks, indicating simultaneous lasing of many modes. More lasing peaks appear at higher pump currents, and they merge to a smooth, broad spectrum. The L-I curve for a L=400-μm-long cavity (inset of FIG. 6B) shows the lasing threshold is 360 mA. The threshold current density is inversely proportional to the cavity length L as expected since the Q-factors increase linearly with L. There was no significant difference between the lasing thresholds for cavities with the same L but different g.

Figure 6C:
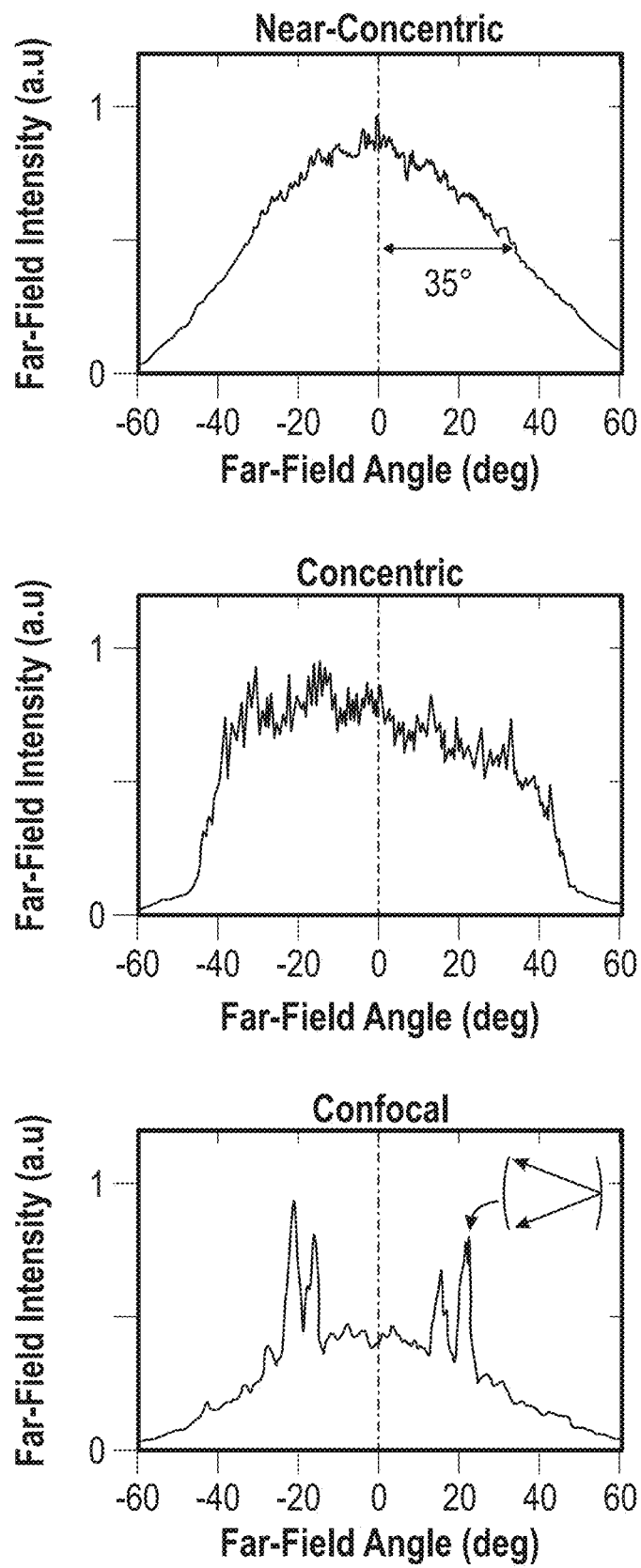
FIG. 6C shows three graphs for far-field patterns measured experimentally for different cavity shapes.
Figure 6D:
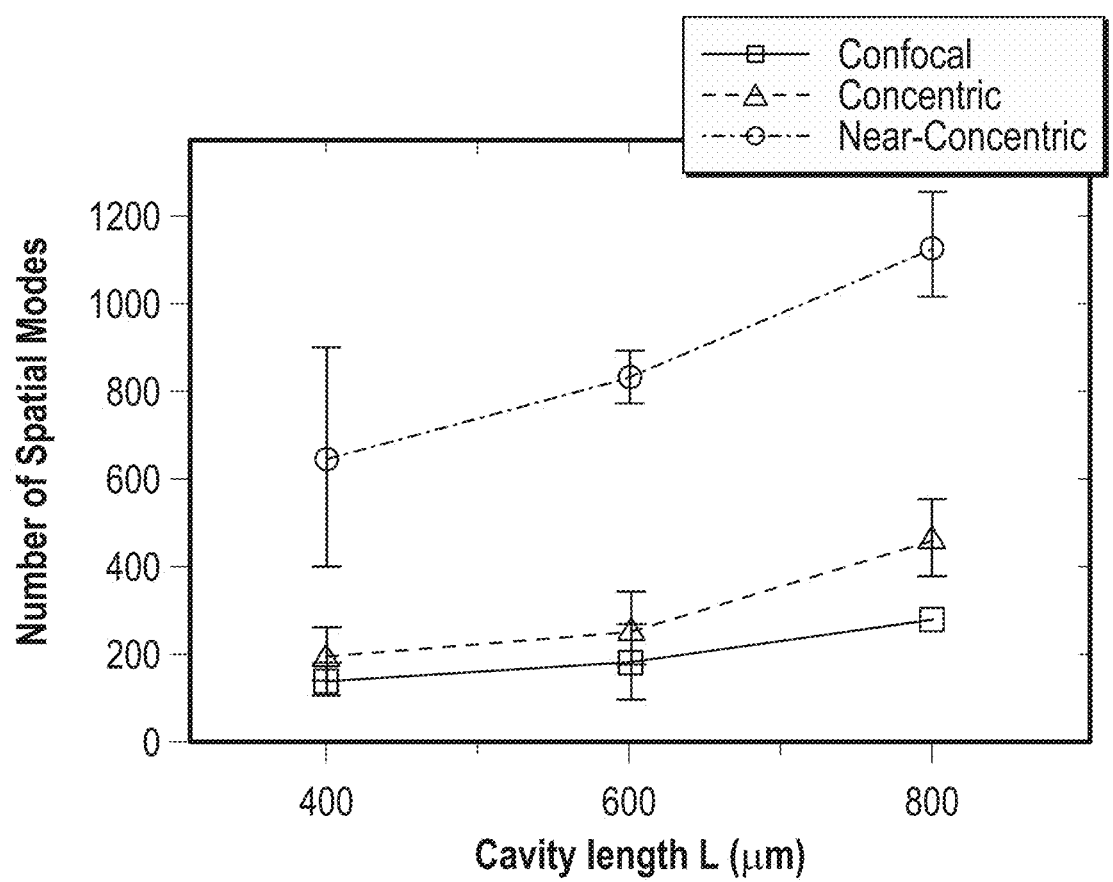
FIG. 6D is a graph that illustrates a number of transverse lasing modes experimentally measured for different cavity shapes and cavity lengths in accordance with embodiments of the present disclosure.

To investigate the emission directionality, the far-field emission patterns were measured at a pump current two times above the lasing threshold. FIG. 6C shows the far-field patterns for three cavity shapes. For the near-concentric cavity (g=−0.74), a directional output beam with a divergence angle (half width at half maximum) of 35° is observed. In some embodiments, laser devices of the present disclosure can produce laser emission having a divergence angle (HWHM) in a range from 20° to 50° in the far field. The concentric cavity (g=−1) shows a flat-top far-field pattern with sharp edges. This pattern is attributed to the broad angular divergence of modes in the concentric cavity. In contrast, the far-field pattern of the confocal cavity features sharp peaks on top of a broad background. The sharp peaks originate from lasing modes based on a V-shaped, non-axial orbit. FIG. 6D illustrates the number of transverse lasing modes in near-concentric (g=−0.74), concentric (g=−1), and confocal (g=0) cavities with different lengths L. The error bars indicate the variation between different cavities of the same g and L. The number of transverse lasing modes is the largest for the near-concentric cavity (g=−0.74). With the ratio W/L fixed, the number of transverse modes increases with L since a wider cavity supports more transverse modes. For the L=800 μm near-concentric cavity (g=−0.74), about 1,000 different transverse modes lase, and their combined emission reduces the speckle contrast to about 0.03 which is the level of below human perception.

Figure 7A:
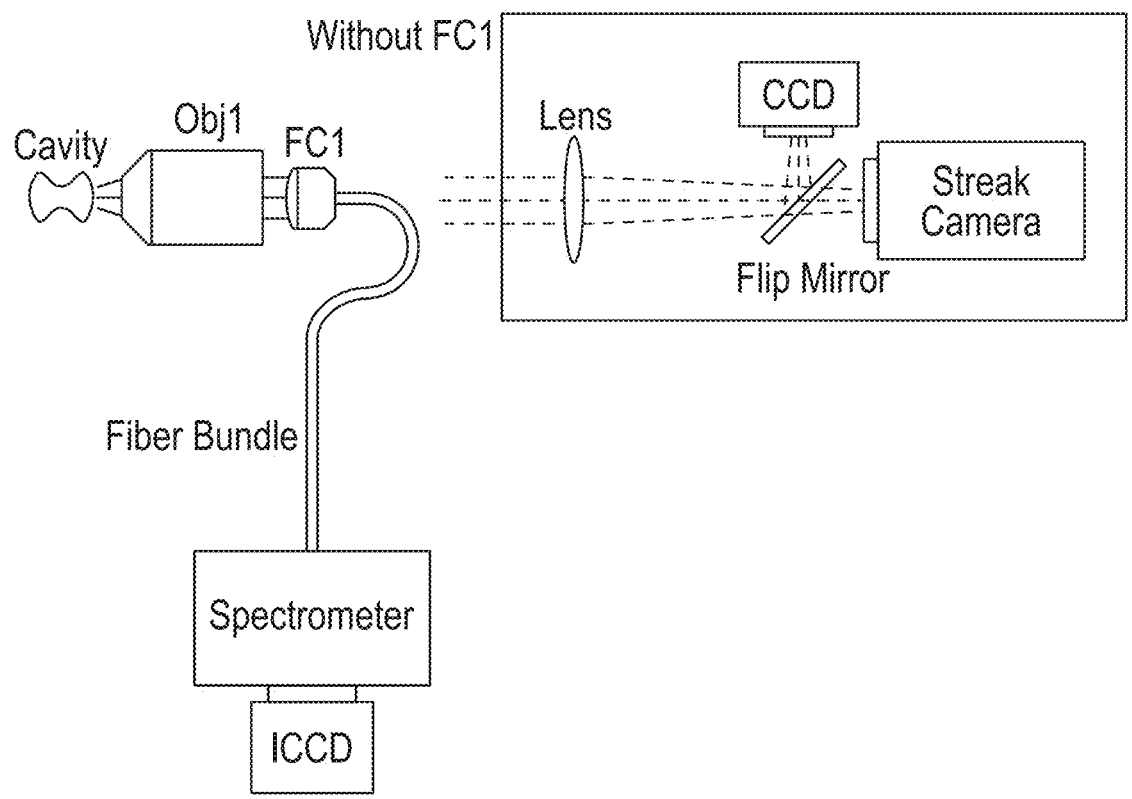
FIG. 7A schematically illustrates an exemplary optical setup to measure the emission spectrum of an embodiment of the laser devices described herein.
Figure 7B:
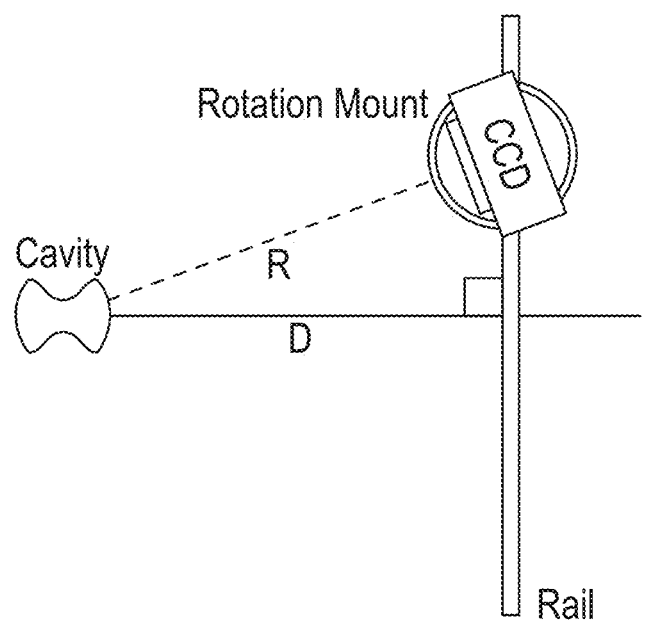
FIG. 7B schematically illustrates an exemplary optical setup to measure the far field intensity pattern of an embodiment of the laser devices described herein.

FIGS. 7A-B schematically illustrates the experimental setup to obtain the results in FIG. 6 The optical setup to measure the emission spectrum is shown in FIG. 7A. Emission from the end facet of a cavity was collected by an objective lens (Obj1) (e.g., a 20× microscope objective with numerical aperture (NA)=0.40). The light was coupled into a fiber bundle by a fiber collimator (FC1, NA=0.50) (left). The laser spectrum was measured by an imaging monochromator (Acton SP300i) equipped with an intensified CCD camera (Andor iStar DH312T-18U-73). For spatially resolved measurement of laser emission, the fiber collimator (FC1) was removed, and the end facet of the cavity was imaged onto a CCD camera or the entrance slit of a streak camera (right).

FIG. 7B illustrates an optical setup to measure the far-field emission patterns. The laser emission was directly measured with a CCD camera on a rotating mount on a rail. In this setup, the objective lens was removed and the laser emission was measured after free-space propagation. A CCD camera (Allied Vision, Manta G-235B) was placed at a distance D=6 cm away from the cavity measured along an axis corresponding to the cavity length L. A large angular range is covered by moving the CCD camera on the rail while rotating the camera to face the cavity at each position. Since the distance R from the cavity to the camera can vary based on a position of the camera on the rail, the measured intensity can be rescaled by $1/R^2$ accordingly. The recorded images were stitched together in the horizontal direction and vertically integrated to obtain the far-field patterns shown in, e.g., FIG. 6C.

Figure 8A:
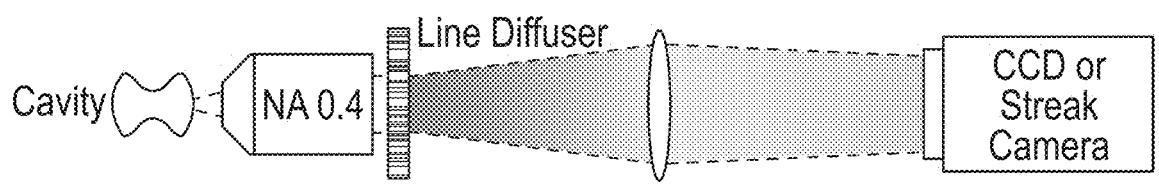
FIG. 8A schematically illustrates an optical setup to evaluate speckle and decoherence of embodiments of the laser devices of the present disclosure using a CCD or streak camera.

The spatial coherence of the laser emission from cavities of different shapes can be characterized. FIG. 8A illustrates an optical setup to evaluate speckle and decoherence of the laser devices 100 of the present disclosure using a CCD or streak camera. The emission is coherent in the direction normal to the wafer since the sample has only one index-guided mode in the vertical direction. To measure the coherence of emission in the horizontal direction (parallel to the wafer), speckle patterns are created using a line diffuser that scatters light only in the horizontal direction. The microscopic structure of the line diffuser (RPC Photonics, EDL-20) consists of fine random elongated grains of about 10 μm width on top of a quasi-periodic structure of 100 μm scale. An objective lens collects the laser emission and the line diffuser is placed in the pupil plane of the objective (6 mm diameter). The laser emission fills the entire aperture of the objective and thus covers hundreds of random elongated grains of the line diffuser. A plano-convex lens in f-f configuration between the diffuser and the CCD camera (Allied Vision, Mako G-125B) allows measurement of the far-field speckle patterns. A CCD camera records the far-field speckle intensity pattern generated by laser emission from a single 2 µs-long pump pulse. In order to quantify the spatial coherence, the speckle contrast is defined as $C=\sigma_1/\langle I \rangle$, where or and $\langle I \rangle$ are the standard deviation and mean of the speckle intensity, respectively. The effective number of distinct transverse lasing modes is given by $M=1/C^2$. The value for M can be calculated based upon the results shown in FIG. 6D for cavities with different g and L, measured at two times of the lasing threshold.

Figure 8B:
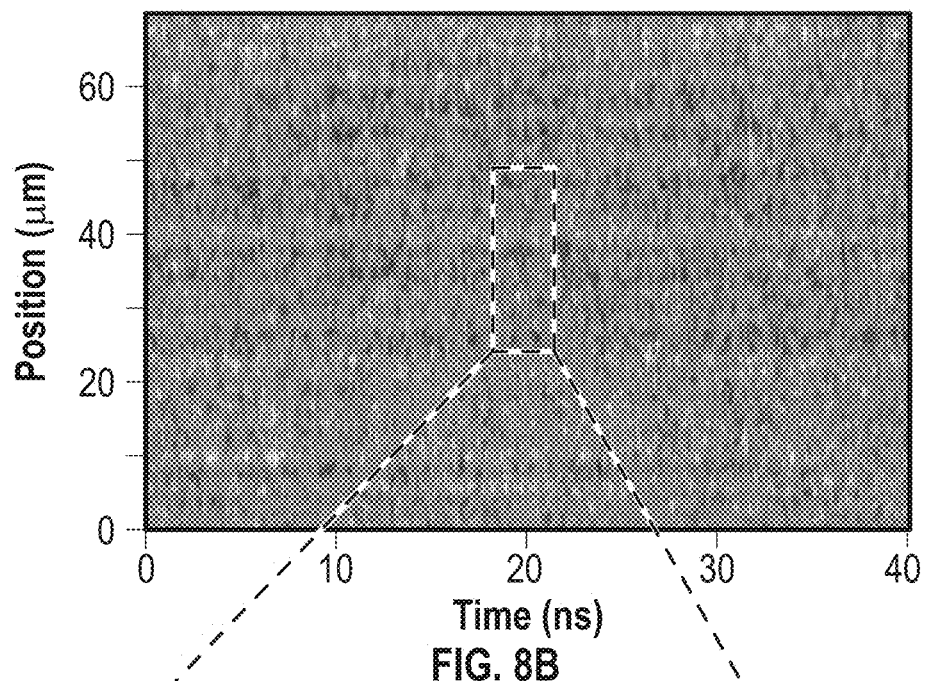
FIG. 8B illustrates the experimentally measured spatio-temporal evolution of the measured far-field speckle pattern produced by an embodiment of the laser device described herein.
Figure 8C:
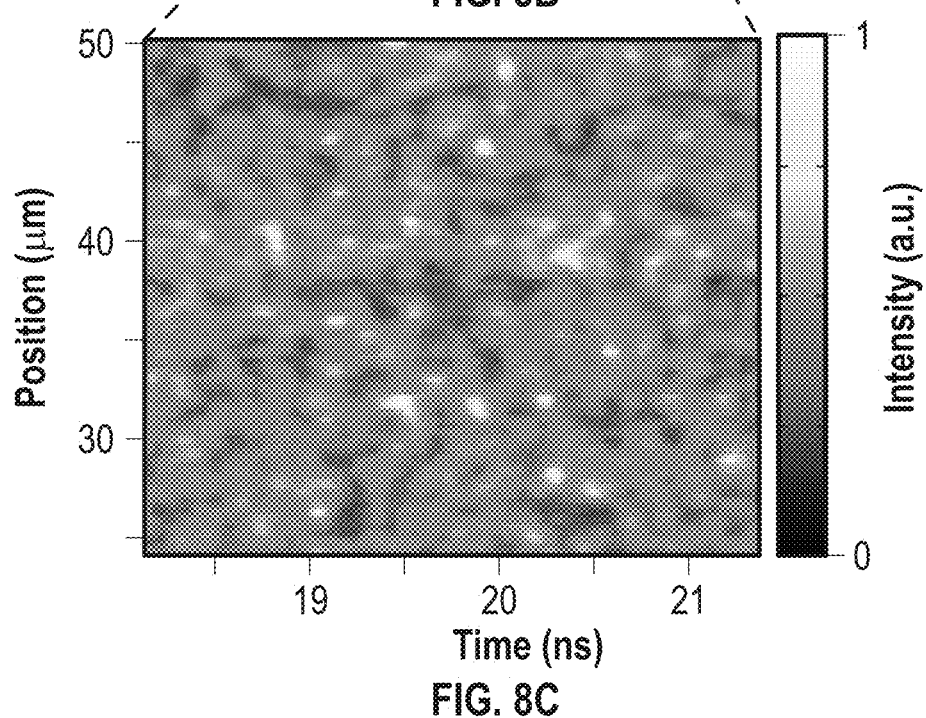
FIG. 8C illustrates a magnified portion of FIG. 8B.

To examine the applicability of embodiments of the laser device 100 according to the present disclosure for ultrafast speckle-free imaging, a determination is made as to how fast decoherence of the emission occurs. A streak camera was used to measure the time-resolved speckle patterns with a temporal resolution of about 60 ps in a setup sketched in FIG. 8B. FIG. 8B shows the spatio-temporal evolution of the measured far-field speckle pattern of a near-concentric cavity laser (g=−0.74, L=400 µm). FIG. 8C illustrates a magnified portion of FIG. 8B. The magnified portion reveals rapid spatial and temporal variations of the intensity pattern.

Figure 8D:
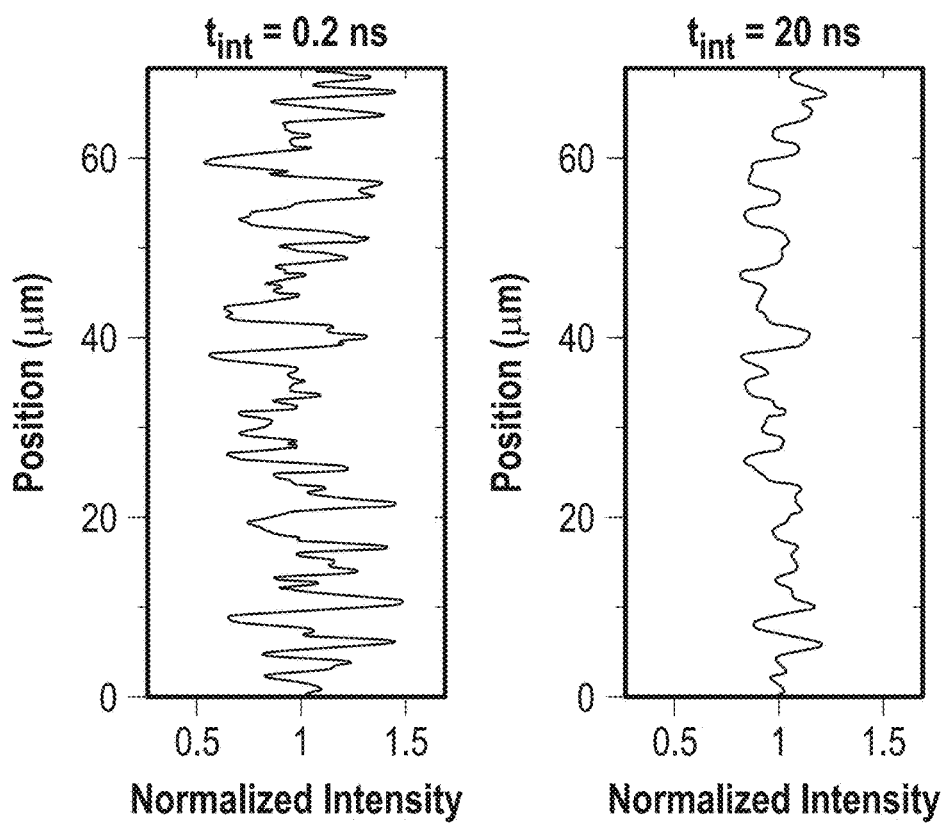
FIG. 8D illustrates normalized intensity across a light beam for different integration times as measured experimentally in an embodiment of the laser devices described herein to demonstrate reduction in speckle.
Figure 8E:
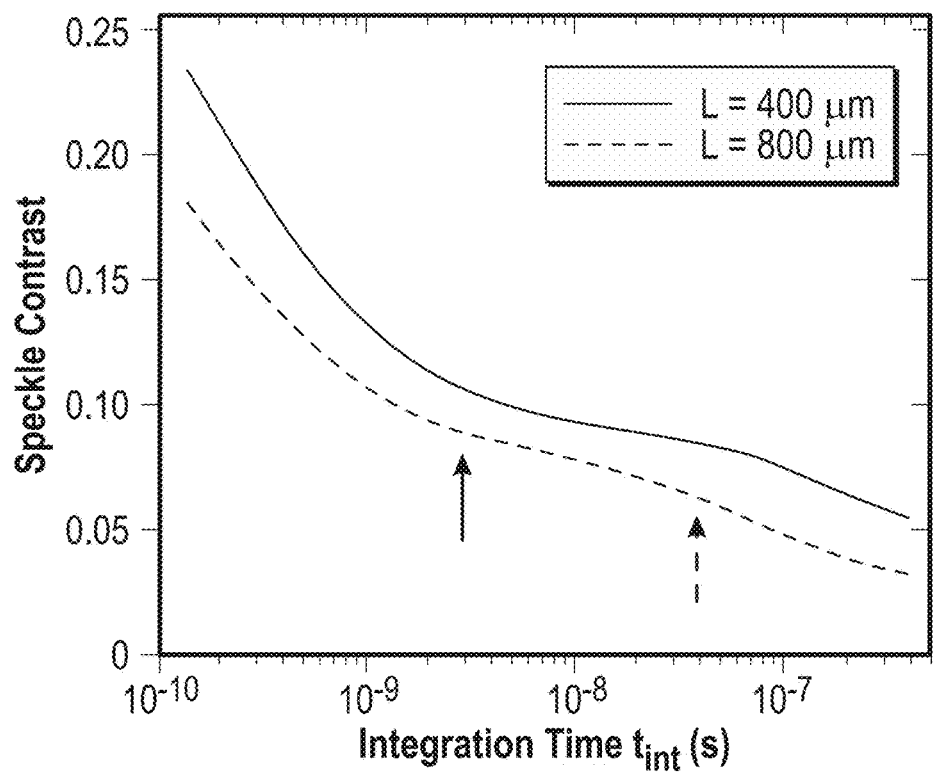
FIG. 8E is a graph that illustrates experimentally measured speckle contrast as a function of integration time for an embodiment of the laser devices described herein.

To quantify the coherence time of the emission, the contrast of speckle patterns is calculated as a function of the integration time. As shown in FIG. 8D, for a short integration time of $t_{int}$=0.2 ns, the speckle has a notable contrast of −0.2. As the integration time increases, the speckle contrast drops quickly. FIG. 8E summarizes the reduction of the speckle contrast for $t_{int}$ from 100 ps to 500 ns. The L=800 µm-long cavity laser features lower speckle contrast than the L=400 µm-long cavity laser for all integration times. After a rapid drop, the contrast starts to saturate, exhibiting a kink at a few nanoseconds (indicated by the solid arrow). A second kink (indicated by a dotted arrow) follows at several tens of nanoseconds after which the speckle contrast further declines. In some embodiments, laser devices of the present disclosure can produce laser beams that exhibit a decoherence time in a range from 100 ps to 500 ns. In accordance with aspects of the present disclosure, the decoherence time is defined by the temporal correlation of the laser emission. With increasing time, the correlation of the laser emission decreases. Thus, the decoherence time is the time it takes for the temporal correlation to become insignificant.

The time scale of the speckle contrast reduction is related to the frequency differences of lasing modes when their linewidths are smaller than their frequency spacings. When the integration time $t_{int}$ is shorter than the inverse frequency spacing of two modes, their temporal beating results in a visible interference pattern that oscillates in time. For an integration time longer than their beating period, the time-varying interference pattern is averaged out, hence the intensity contrast of the speckle pattern created by these two modes is reduced. With increasing integration time, more and more lasing modes become incoherent, as their frequency spacings exceed $1/t_{int}$, and the speckle contrast continues dropping. Once $t_{int}$ is long enough to average out the beating of even the closest pairs of lasing modes, the speckle contrast cannot reduce further. The average frequency spacing between adjacent modes is estimated as several hundred MHz in exemplary cavities described herein, whereas the typical linewidth of conventional semiconductor lasers (10-100 MHz) is smaller than the frequency spacing. Thus, the integration time needed for contrast reduction is determined by the mode spacing and is estimated to be a few nanoseconds, which matches the experimental observations. The additional reduction of the speckle contrast at a few ten nanoseconds is attributed to a thermally-induced change of lasing modes. When the lasing modes change, the output emission patterns change as well and their superposition further reduces the speckle contrast.

FIG. 9A illustrates the measured speckle pattern from a near-concentric cavity laser in accordance with embodiments disclosed herein. The far-field speckle pattern has an intensity contrast C=0.035 and the effective number of distinct transverse lasing modes is $M=1/C^2$=820. For comparison, the speckle pattern from a source with high spatial coherence (a frequency-doubled Nd:YAG laser [Continuum, Minilite]) was also measured with the same optical configuration, and the results are shown in FIG. 9B. The spatially coherent Nd:YAG laser beam ($\lambda$=532 nm) passing through the same diffuser created a speckle pattern with contrast C=0.76. The typical speckle size on the CCD camera is 2.5 pixels as calculated from the intensity autocorrelation function such that the speckle contrast reduction due to undersampling is negligible. For each speckle contrast measurement, speckle patterns were repeatedly measured for different lateral positions of the line diffuser, and the speckle contrasts for these different disorder realizations were averaged.

In order to measure time-resolved speckle patterns, the CCD camera was replaced by a streak camera (Hamamatsu C5680) with a fast sweep unit (M5676). The streak camera was operated with 20 ns-long time windows and the temporal resolution was about 60 ps. The time-resolved speckle patterns in longer time windows were obtained by putting together multiple 20 ns-long streak images for consecutive time intervals.

When comparing different cavity geometries, small exemplary cavities of length L=20 µm and width W=14 µm were simulated to keep the computation time reasonably short. However, laser cavities 102 in devices can be much larger (e.g., L=400-800 µm and W=283-566 µm) in order to increase the total number of transverse modes and lower the pump current density to reduce heating. To verify that the optimal value of the stability parameter g found in simulations holds for larger cavities, simulations can be performed using a L=40 µm-long cavity.

Figure 10B:
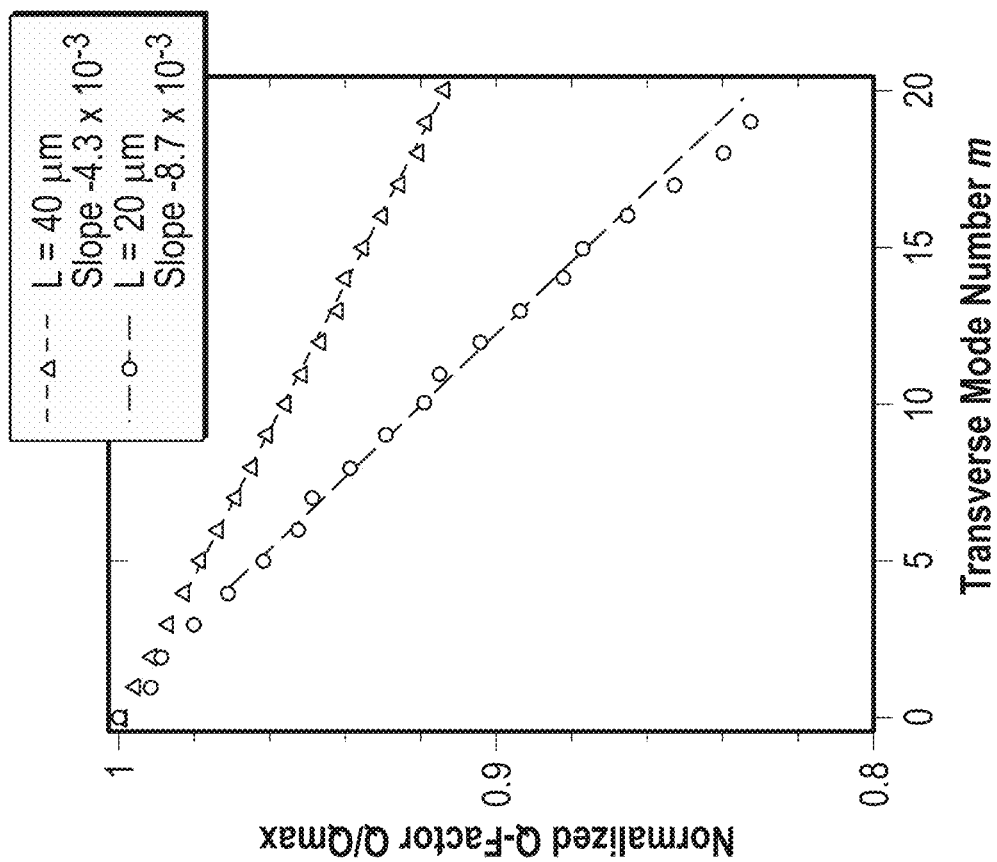
FIG. 10B is a graph that shows a dependence of Q-factors on transverse mode number m for the cavities described with relation to FIG. 10A.
Figure 10A:
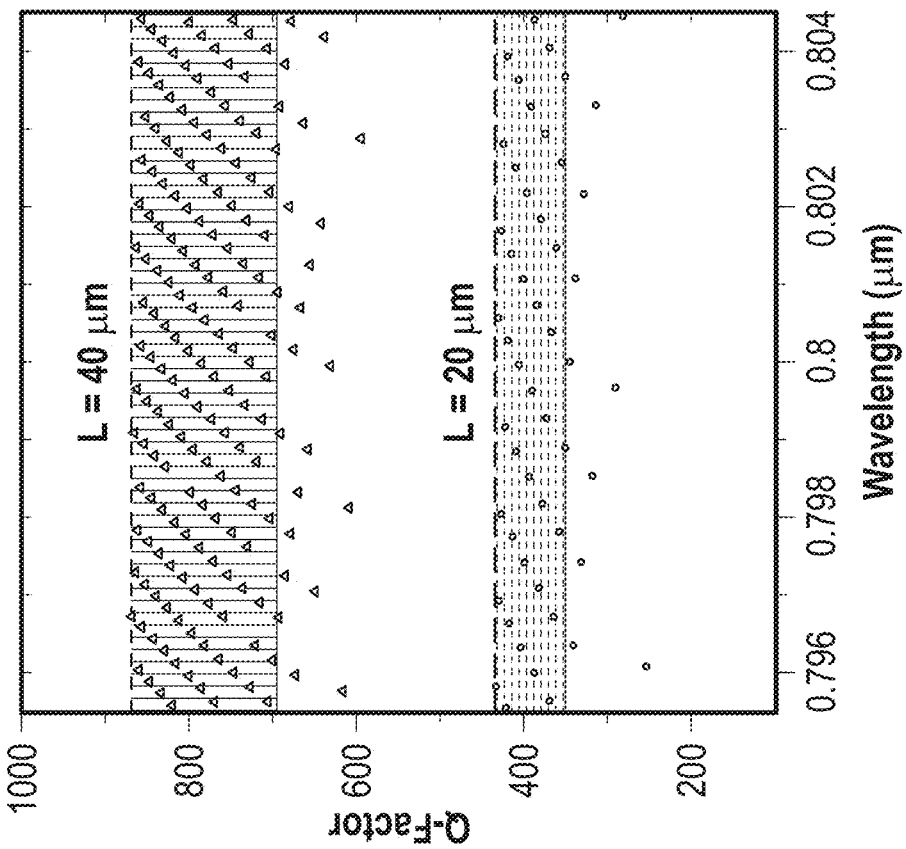
FIG. 10A shows high-Q modes for near-concentric cavities with different lengths according to various embodiments described herein.

FIG. 10A shows high-Q modes in two near-concentric cavities (g=−0.74) with L=20 µm and L=40 µm. The ratio $L/W=\sqrt{2}$ is the same for both cavities. The wavelengths and quality factors of the modes with relatively high Q are shown. The maximum Q-factor $Q_{max}$ of the L=40 µm and L=20 µm cavities are 867 and 433, respectively, as expected from Eq. 2. The shaded regions in FIG. 10A indicate the high-Q regions defined as 0.8 $Q_{max}<Q<Q_{max}$. The high-Q resonances of the L=40 µm-long cavity are more closely spaced than those of the L=20 µm-long cavity since the total number of resonances is proportional to the area of the cavity.

FIG. 10B shows the dependence of the Q-factors on the transverse mode number m for the near-concentric cavities (g=−0.74) for cavity length L=20 µm and cavity length L=40 µm. Q is normalized by $Q_{max}$ of each cavity. The dotted lines are linear fits and their slopes are shown. The Q-factors decrease approximately linearly with the transverse mode number m wherein the slope of the decrease for the cavity length L=40 µm-long cavity is about one-half of that for the cavity length L=20 µm-long cavity. This indicates that the number of different transverse modes with high-Q is about twice as large for the cavity length L=40 µm-long cavity as for the cavity length L=20 µm-long cavity. This linear scaling was verified for another cavity geometry, g=−0.54, where the slopes are 1.2×10-2 and 6.1×10-3 for L=20 µm and L=40 µm-long cavities, respectively. Due to this linear scaling, the optimal value of g, at which the number of high-Q transverse modes is maximal, is independent of the cavity size.

The first kink in the curve in FIG. 8E indicates that the speckle contrast saturates at the integration time of a few nanoseconds. This time scale is related to the average frequency spacing between neighboring modes. The average mode spacing is estimated using the simulation results for a small cavity and linear scaling is applied to the cavity size as explained in greater detail below in relation to FIGS. 10A-10B. For the near-concentric cavity (g=−0.74) with L-20 μm, the number of high-Q transverse modes is 23 as given in FIG. 3A. The free-spectral-range (FSR) is given by the longitudinal mode spacing, c/2 nL=2.225 THz. Within one FSR, there is a series of transverse modes with m=0-22. Thus the average frequency spacing between adjacent transverse modes is about 96.7 GHz.

In exemplary laser cavities with L=400 μm, both L and W are typically increased by a factor of 20 compared to the simulated cavities described herein. Consequently, the FSR is reduced by a factor of 20, and the number of transverse modes within one FSR increases by 20. Therefore, the average mode spacing is reduced by a factor of 400, which yields 242 MHz. The beating of two modes is averaged out when the integration time is longer than the inverse mode spacing, which is about 4 ns. This estimation gives the correct order of magnitude for the integration time at which the speckle contrast stops dropping in FIG. 8E.

The speckle contrast over time (FIG. 8E) displays a second kink at several tens of nanoseconds after which the contrast further decreases. This behavior is caused by thermal effects that cause the lasing modes to change in time. Time-resolved measurements of the lasing spectrum were conducted to observe the spectro-temporal dynamics. The gating function of the intensified CCD camera is used to acquire the lasing spectra with 10-50 ns time resolution. The spectra from multiple measurements with consecutive time intervals during the pump pulse are combined to obtain the spectrochronogram of a whole pulse. FIG. 11A shows the measured spectrochronogram I(t,λ) of a near-concentric cavity (g=−0.74) laser with L=400 μm at a pump current of two times the lasing threshold. The temporal resolution is 50 ns. The spectra at 0.8 μs and 1.2 μs are plotted on the right as dashed and solid lines, respectively. Since thermal equilibrium is not reached, the emission spectrum red-shifts during the pulse due to sample heating. FIG. 1B shows the spectrochronogram in a 400 ns-long interval with a finer temporal resolution of 10 ns. As seen here, the lasing peaks appear and disappear in time.

The measured spectrochronogram reveals changes to the lasing spectrum during the pulse. Lasing peaks appear or disappear over the course of the pump pulse as different lasing modes turn on or off. In order to quantify the time scale of these changes, calculate the temporal correlation function of the spectral changes defined as $$C(\tau)=\Sigma_\lambda \langle \delta I(t,\lambda)\delta I(t+\tau,\lambda)\rangle_\tau \quad \text{(Equation 4)}$$

where $\delta I(t,\lambda) \equiv [I(t,\lambda)-\langle I(t,\lambda)\rangle t]/\sigma_I(\lambda)$ is the normalized change of the emission intensity and or $\sigma_I(\lambda)$ is the standard deviation. The half width at half maximum (HWHM) of the temporal correlation function $C_\tau$ gives the time scale of the spectral dynamics. FIG. 11C illustrates the autocorrelation function C(τ) of the time-resolved spectra in FIG. 11B. The half width at half maximum (HWHM) of C(τ) is about 40 ns. The sharp drop of $C_\tau$ at τ~0 is caused by the measurement noise. The HWHM of $C_\tau$ is about 40 ns, extrapolated from the more gradual decrease of $C_\tau$ after the initial drop. This is approximately the integration time in FIG. 8E where the second kink occurs, thus the further reduction of the speckle contrast is caused by the switching of lasing modes. The new lasing modes generate distinct speckle patterns that are superposed to the ones created by the old lasing modes, reducing the intensity contrast of the time-integrated speckle patterns.

Figure 12:
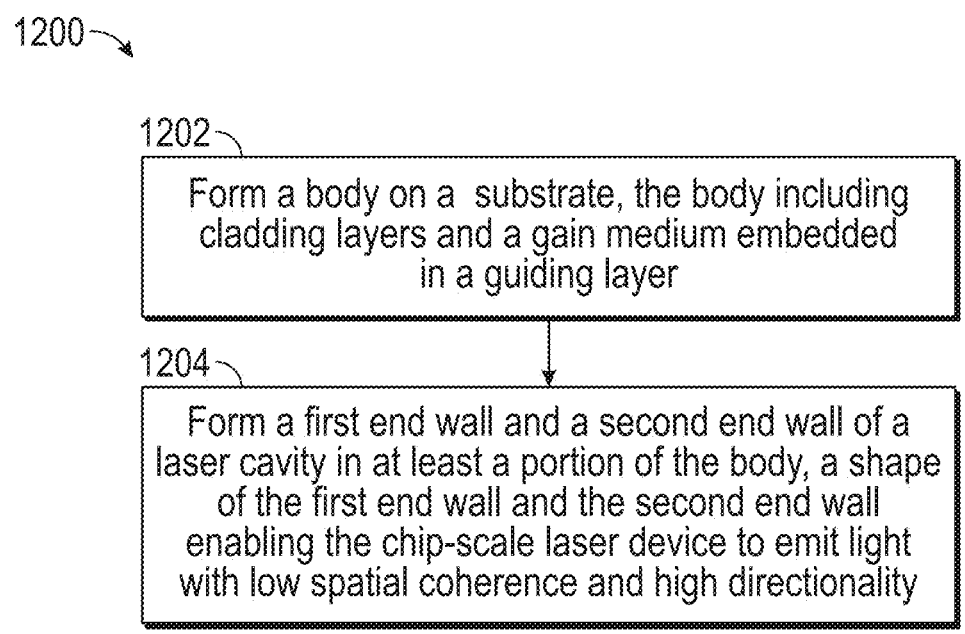
FIG. 12 illustrates a flowchart of a method of producing a chip-scale laser device in accordance with various embodiments described herein.

FIG. 12 illustrates a flowchart for a method of producing a chip-scale laser device as shown and described in relation to previous figures in this application and, in particular, FIG. 1. The method 1200 includes forming a body on a substrate (1202). The body includes cladding layers and a gain medium embedded in a guiding layer. The method 1200 also includes forming a first end wall and a second end wall of a laser cavity in at least a portion of the body (1204). A shape of the first end wall and the second end wall enables the chip-scale laser device to emit light with low spatial coherence and high directionality.

Exemplary flowcharts are provided herein for illustrative purposes and are non-limiting examples of methods. One of ordinary skill in the art will recognize that exemplary methods may include more or fewer steps than those illustrated in the exemplary flowcharts, and that the steps in the exemplary flowcharts may be performed in a different order than the order shown in the illustrative flowcharts.

The foregoing description of the specific embodiments of the subject matter disclosed herein has been presented for purposes of illustration and description and is not intended to limit the scope of the subject matter set forth herein. It is fully contemplated that other various embodiments, modifications, and applications will become apparent to those of ordinary skill in the art from the foregoing description and accompanying drawings. Thus, such other embodiments, modifications, and applications are intended to fall within the scope of the following appended claims. Further, those of ordinary skill in the art will appreciate that the embodiments, modifications, and applications that have been described herein are in the context of particular environment, and the subject matter set forth herein is not limited thereto, but can be beneficially applied in any number of other manners, environments, and purposes. Accordingly, the claims set forth below should be construed in view of the full breadth and spirit of the novel features and techniques as disclosed herein.

The invention claimed is:

1. A chip-scale laser device, comprising:
   a substrate; and
   a laser cavity on the substrate and including cladding layers and a gain medium embedded in a guiding layer, the laser cavity having a first end wall and a second end wall,
   wherein a shape of the first end wall and the second end wall is defined to cause the chip-scale laser device to emit light with a spatial coherence that generates a speckle contrast for light emitted by the chip-scale laser device that is less than 0.03 and a directionality in which light emission from the chip-scale laser device has a half-width at a half-maximum divergence angle in a range from 20 degrees to 50 degrees in a far field.

2. The chip-scale laser device of claim 1, wherein the shape of the first end wall and the second end wall creates a near-concentric cavity.

3. The chip-scale laser device of claim 1, wherein a decoherence time for a laser beam produced by the chip-scale laser device is in a range from 100 picoseconds to 500 nanoseconds.

4. The chip-scale laser device of claim 1, wherein a ratio of a length of the laser cavity and a width of the laser cavity is equal to about a square root of two.

5. The chip-scale laser device of claim 1, wherein the shape of the first end wall and the second end wall cause the laser cavity to have a cavity stability parameter in a range from −0.6 to −0.8.

6. The chip-scale laser device of claim 1, wherein the chip-scale laser device is a semiconductor laser.

7. The chip-scale laser device of claim 1, wherein the laser cavity is tuned to provide near degeneracy for Q-factors for transverse modes.

8. The chip-scale laser device of claim 1, further comprising a pair of electrodes that electronically pump the gain medium.

9. The chip-scale laser device of claim 1, wherein the laser cavity produces continuous wave light output.

10. The chip-scale laser device of claim 1, wherein the gain medium comprises gallium arsenide.

11. The chip-scale laser device of claim 1, wherein the guiding layer comprises aluminum gallium arsenide.

12. A method of manufacturing a chip-scale laser device, comprising:
    forming a body on a substrate, the body including cladding layers and a gain medium embedded in a guiding layer; and
    forming a first end wall and a second end wall of a laser cavity in at least a portion of the body, a shape of the first end wall and the second end wall enabling the chip-scale laser device to emit light with a spatial coherence that generates a speckle contrast for light emitted by the chip-scale laser device that is less than 0.03 and a directionality in which light emission from the chip-scale laser device has a half-width at a half-maximum divergence angle in a range from 20 degrees to 50 degrees in a far field.

13. The method of claim 12, further comprising disposing a back contact on a back surface of the substrate.

14. The method of claim 12, wherein forming the laser cavity includes shaping the first end wall and the second end wall to create a near-concentric cavity.

15. The method of claim 12, further comprising defining a length of the laser cavity and a width of the laser cavity to have a ratio between the length and the width that is equal to about a square root of two.

16. The method of claim 12, wherein forming the laser cavity includes shaping the first end wall and the second end wall such that the laser cavity has a cavity stability parameter in a range from −0.6 to −0.8.

17. The method of claim 12, wherein forming the laser cavity includes shaping the first end wall and the second end wall such that the laser cavity is tuned to provide near degeneracy for Q-factors for transverse modes.

18. A method of manufacturing a chip-scale laser device, comprising:
    forming a body on a substrate, the body including cladding layers and a gain medium embedded in a guiding layer;
    forming a first end wall and a second end wall of a laser cavity in at least a portion of the body by defining the shape of the laser cavity in a photoresist layer disposed on a silicon dioxide layer disposed on the body using photolithography, the shape of the first end wall and the second end wall enabling the chip-scale laser device to emit light with a specified spatial coherence and a specified directionality;
    transferring the shape of the laser cavity to the silicon dioxide layer;
    removing the remaining photoresist layer;
    forming the laser cavity in the body by dry etching using the silicon dioxide layer as a mask; and
    removing the silicon dioxide layer.

19. The method of claim 18, wherein forming the laser cavity includes shaping the first end wall and the second end wall to create a near-concentric cavity.

20. The method of claim 18, further comprising defining a length of the laser cavity and a width of the laser cavity to have a ratio between the length and the width that is equal to about a square root of two.

* * * * *